United States Patent
Kaneko et al.

(10) Patent No.: US 12,098,476 B2
(45) Date of Patent: Sep. 24, 2024

(54) METHOD FOR PRODUCING A SIC SUBSTRATE VIA AN ETCHING STEP, GROWTH STEP, AND PEELING STEP

(71) Applicants: KWANSEI GAKUIN EDUCATIONAL FOUNDATION, Hyogo (JP); TOYOTA TSUSHO CORPORATION, Nagoya (JP)

(72) Inventors: Tadaaki Kaneko, Hyogo (JP); Kiyoshi Kojima, Tokyo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 19 days.

(21) Appl. No.: 17/633,118

(22) PCT Filed: Aug. 5, 2020

(86) PCT No.: PCT/JP2020/030080
§ 371 (c)(1),
(2) Date: Feb. 4, 2022

(87) PCT Pub. No.: WO2021/025086
PCT Pub. Date: Feb. 11, 2021

(65) Prior Publication Data
US 2022/0290324 A1    Sep. 15, 2022

(30) Foreign Application Priority Data
Aug. 6, 2019    (JP) .................................. 2019-144545

(51) Int. Cl.
*C30B 23/06*    (2006.01)
*C30B 25/18*    (2006.01)
(Continued)

(52) U.S. Cl.
CPC ............ *C30B 25/20* (2013.01); *C30B 25/186* (2013.01); *C30B 29/36* (2013.01); *C30B 33/04* (2013.01)

(58) Field of Classification Search
CPC ..... C30B 23/00; C30B 23/002; C30B 23/005; C30B 23/02; C30B 23/06; C30B 23/063;
(Continued)

(56) References Cited

U.S. PATENT DOCUMENTS

2009/0221131 A1*   9/2009  Kubota .................. C30B 29/40
                                                                                         438/478
2016/0160384 A1    6/2016  Danno
(Continued)

FOREIGN PATENT DOCUMENTS

CN    109072478 A    12/2018
JP    2008-074664 A    4/2008
(Continued)

OTHER PUBLICATIONS

English Translation of International Search Report from PCT/JP2020/030080 dated Oct. 13, 2020 (3 pages).
(Continued)

*Primary Examiner* — Kenneth A Bratland, Jr.
(74) *Attorney, Agent, or Firm* — Calfee, Halter & Griswold LLP

(57) ABSTRACT

The present invention addresses the problem of providing a novel SiC substrate production method. The SiC substrate production method according to the present invention comprises an etching step S10 of etching a SiC base substrate 10, a crystal growth step S20 of growing a SiC substrate layer 13 on the SiC base substrate 10 to produce a SiC substrate body 20, and a peeling step S30 of peeling at least a portion of the SiC substrate body 20 to produce a SiC substrate 30, the method being characterized in that each of the etching
(Continued)

step S10 and the crystal growth step S20 is a step of arranging the SiC base substrate 10 and a SiC material 40 so as to face each other and heating the SiC base substrate 10 and the SiC material 40 so as to form a temperature gradient between the SiC base substrate 10 and the SiC material 40.

11 Claims, 10 Drawing Sheets

(51) Int. Cl.
  *C30B 25/20* (2006.01)
  *C30B 29/36* (2006.01)
  *C30B 33/04* (2006.01)
(58) Field of Classification Search
  CPC ....... C30B 23/066; C30B 25/00; C30B 25/02; C30B 25/10; C30B 25/16; C30B 25/18; C30B 25/186; C30B 25/20; C30B 29/00; C30B 29/10; C30B 29/36; C30B 33/00; C30B 33/02; C30B 33/04; C30B 33/08
  USPC .......... 117/84, 88–89, 94, 97, 105–106, 937, 117/951
  See application file for complete search history.

(56) References Cited

U.S. PATENT DOCUMENTS

| | | | |
|---|---|---|---|
| 2017/0323797 A1 | 11/2017 | Torimi et al. | |
| 2017/0372965 A1 | 12/2017 | Nishibayashi et al. | |
| 2018/0216251 A1* | 8/2018 | Aigo | H01L 29/161 |
| 2019/0136409 A1* | 5/2019 | Kaneko | H01L 21/02631 |
| 2019/0136411 A1 | 5/2019 | Kaneko et al. | |
| 2020/0066847 A1 | 2/2020 | Mitani et al. | |
| 2020/0230748 A1* | 7/2020 | Ikeno | C09K 13/02 |
| 2020/0388538 A1 | 12/2020 | Swoboda et al. | |

FOREIGN PATENT DOCUMENTS

| | | | | | |
|---|---|---|---|---|---|
| JP | 2009256138 A | | 11/2009 | | |
| JP | 2013049161 A | * | 3/2013 | | |
| JP | 2015-24932 A | | 2/2015 | | |
| JP | 2016-015463 A | | 1/2016 | | |
| JP | 2017037944 A | | 2/2017 | | |
| JP | 2018158858 A | * | 10/2018 | | |
| JP | 2019-26500 A | | 2/2019 | | |
| TW | 201630061 A | | 8/2016 | | |
| WO | 2016/114382 A1 | | 7/2016 | | |
| WO | WO-2017018533 A1 | * | 2/2017 | ........... | C30B 23/025 |
| WO | WO-2017188381 A1 | * | 11/2017 | ............ | C30B 23/02 |
| WO | 2018192689 A1 | | 10/2018 | | |
| WO | 2018/211737 A1 | | 11/2018 | | |

OTHER PUBLICATIONS

Furusho et al., "Crystal growth of silicon carbide in hydrogen atmosphere by sublimation close space technique", Journal of Crystal Growth, Elsevier, Amsterdam, NL, vol. 237-239, Apr. 1, 2002 (Apr. 1, 2002), pp. 1235-1238, XP004355973.

Kalabukhova et al.,"EPR, ESE and Pulsed ENDOR Study of Nitrogen Related Centers in 4H—SiC Wafers Grown by Different Technologies", Materials Science Forum, vol. 556-557, Jan. 1, 2007 (Jan. 1, 2007), pp. 355-358, XP093073407.

Communication and Supplementary European Search Report from European Patent Application No. EP 20849437.7 dated Aug. 23, 2023 (9 pages).

* cited by examiner (a)

(b)

(a)

(b)

(a)

(b)

(c)

(d)

(a)

(b)

METHOD FOR PRODUCING A SIC SUBSTRATE VIA AN ETCHING STEP, GROWTH STEP, AND PEELING STEP

CROSS-REFERENCE TO RELATED APPLICATIONS

This application is a 371 of PCT Application No. PCT/JP2020/030080, filed on Aug. 5, 2020, which claims priority to Japanese Application No. 2019-144545, filed on Aug. 6, 2019, the contents of which are hereby incorporated by reference as if recited in their entirety.

TECHNICAL FIELD

The present invention relates to a method for producing a SiC substrate.

BACKGROUND ART

Silicon carbide (SiC) semiconductor devices are being developed for industrialization because of their high withstand voltage, high efficiency, and capability of high temperature operation as compared to silicon (Si) and gallium arsenide (GaAs) semiconductor devices.

In general, a SiC substrate (SiC wafer) is produced by forming a SiC ingot obtained by growing a single crystal SiC on a seed crystal substrate by a sublimation method or the like and slicing the SiC ingot.

In addition, a method has been proposed in which SiC wafers having an epitaxial layer can be produced one by one. Patent Literature 1 discloses a technology of producing SiC wafers one by one by growing an epitaxial layer and a SiC substrate on a seed crystal substrate and removing the result from the seed crystal substrate.

CITATION LIST

Patent Literature

Patent Literature 1: JP 2015-24932 A

SUMMARY OF INVENTION

Technical Problem

However, in Patent Literature 1, it is necessary to perform CMP polishing on the growth surface of the seed crystal substrate every time one SiC substrate is produced. Therefore, there is a problem that the cost of CMP polishing increases.

Patent Literature 1 further discloses that the SiC substrate disclosed in Patent Literature 1 is grown by a solution method, a high temperature CVD method, or a sublimation method. In particular, Patent Literature 1 discloses that "By growing a SiC substrate using the solution method, it is possible to perform growth at a high growth rate, and since crystal growth is performed in a state close to thermal equilibrium, a high-quality substrate with few defects can be obtained". However, the solution method has a problem that it is difficult to obtain a large-diameter SiC substrate.

The high temperature CVD method has a problem that it is difficult to increase the diameter and the productivity is low. The sublimation method has a problem that it is difficult to increase the diameter and the defect density is high.

An object of the present invention is to provide a method for producing a novel SiC substrate.

Another object of the present invention is to provide a method for producing a SiC substrate capable of producing a large-diameter SiC substrate.

Solution to Problem

The present invention that solves the above objects is a method for producing a SiC substrate, the method including:
an etching step of etching a SiC base substrate;
a crystal growth step of growing a SiC substrate layer on the SiC base substrate to obtain a SiC substrate body; and
a peeling step of peeling a part of the SiC substrate body to obtain a SiC substrate, in which the etching step and the crystal growth step are steps of arranging the SiC base substrate and the SiC material so as to face each other, and performing heating so as to form a temperature gradient between the SiC base substrate and the SiC material.

As described above, by including the etching step and the crystal growth step, a SiC substrate can be produced without performing CMP polishing.

Further, in the etching step and the crystal growth step, the SiC base substrate can be heat-treated in the same environment (apparatus system). Therefore, it is possible to remove an subsurface damaged layer and crystal growth of the SiC substrate layer with one apparatus system, and it is not necessary to introduce a plurality of apparatuses, so that the cost can be significantly reduced.

Further, the life of the SiC material of the present invention can be extended by including the etching step and the crystal growth step.

In a preferred mode of the present invention, the etching step and the crystal growth step are steps of heating the SiC base substrate and the SiC material in an atmosphere containing Si element and C element.

As described above, since the etching step and the crystal growth step are steps of performing heating in an atmosphere containing Si element and C element, a higher-quality SiC substrate can be produced.

In a preferred mode of the present invention, the etching step and the crystal growth step are steps of heating the SiC base substrate and the SiC material in a semi-closed space.

As described above, since the etching step and the crystal growth step are steps of performing heating in a semi-closed space, a higher-quality SiC substrate can be produced.

In a preferred mode of the present invention, the etching step and the crystal growth step are steps of arranging the SiC base substrate in a main container containing the SiC material and performing heating.

As described above, in the etching step and the crystal growth step, by using the main container containing the SiC material, a semi-closed space having an atmosphere containing Si element and C element can be easily formed.

In a preferred mode of the present invention, the etching step is a step of arranging the SiC base substrate and the SiC material so as to face each other and performing heating so that the SiC base substrate is on the high temperature side and the SiC material is on the low temperature side.

In a preferred mode of the present invention, the etching step includes a step of arranging a SiC base substrate and a SiC material so as to face each other in a semi-closed space having an atomic number ratio Si/C of greater than 1, and performing heating so that the SiC base substrate is on the high temperature side and the SiC material is on the low temperature side.

As described above, by etching the SiC base substrate using the temperature gradient as a driving force, it is possible to remove or reduce the subsurface damaged layer and macro-step bunching, and to produce a higher-quality SiC substrate.

As described above, since an aspect is adopted in which the surface of the SiC base substrate is etched by providing a temperature gradient between the SiC base substrate and the SiC material, the in-plane temperature distribution of the SiC base substrate can be prevented from being greatly deferent depending on the position. Therefore, it is possible to produce a high-quality and large-diameter (equal to or greater than six inches, and further, equal to or greater than eight inches) substrate.

In a preferred mode of the present invention, the crystal growth step is a step of arranging the SiC base substrate and the SiC material so as to face each other and performing heating so that the SiC base substrate is on the low temperature side and the SiC material is on the high temperature side.

In a preferred mode of the present invention, the crystal growth step includes a step of arranging a SiC base substrate and a SiC material so as to face each other in a semi-closed space having an atomic number ratio Si/C of greater than 1, and performing heating so that the SiC base substrate is on the low temperature side and the SiC material is on the high temperature side.

In a preferred mode of the present invention, the crystal growth step includes a step of arranging a SiC base substrate and a SiC material so as to face each other in a semi-closed space having an atomic number ratio Si/C of equal to or less than 1, and performing heating so that the SiC base substrate is on the low temperature side and the SiC material is on the high temperature side.

As described above, by growing the SiC substrate layer using the temperature gradient as a driving force, it is possible to remove or reduce the basal plane dislocation and macro-step bunching, and to produce a higher-quality SiC substrate.

As described above, since an aspect is adopted in which the SiC substrate layer is grown by providing a temperature gradient between the SiC base substrate and the SiC material, the in-plane temperature distribution of the SiC base substrate can be prevented from being greatly deferent depending on the position. Therefore, it is possible to produce a high-quality and large-diameter (equal to or greater than six inches, and further, equal to or greater than eight inches) substrate.

In a preferred mode of the present invention, the peeling step includes a laser irradiation step of introducing a damaged layer into the SiC substrate body and a separation step of performing separation with the damaged layer as a starting point.

As described above, the material loss can be reduced by including the laser irradiation step and the separation step. Therefore, there is no limitation on the thickness of the SiC substrate body, and it is not necessary to form the SiC substrate body thick.

A preferred mode of the present invention further includes an etching step of etching the SiC base substrate that has been peeled, a crystal growth step of growing a SiC substrate layer on the SiC base substrate to obtain a SiC substrate body, and a peeling step of peeling a part of the SiC substrate body.

A preferred mode of the present invention further includes an etching step of etching the SiC substrate layer that has been peeled, a crystal growth step of growing another SiC substrate layer on the SiC substrate layer to obtain a SiC substrate body, and a peeling step of peeling a part of the SiC substrate body.

Advantageous Effects of Invention

According to the present invention, it is possible to provide a method for producing a novel SiC substrate.

Further, according to the present invention, it is possible to provide a method for producing a SiC substrate capable of producing a large-diameter SiC substrate.

Other issues, features and advantages will become apparent by reading the description of embodiments described below as taken up with the dsourceings and the claims.

BRIEF DESCRIPTION OF DSOURCEINGS

DESCRIPTION OF EMBODIMENTS

Hereinafter, preferred embodiments of the present invention will be described in detail with reference to the dsourceings. The technical scope of the present invention is not limited to the embodiments illustrated in the accompanying dsourceings, and can be appropriately changed within the scope described in the claims.

<<Production Method of SiC Substrate>>

Figure 1:
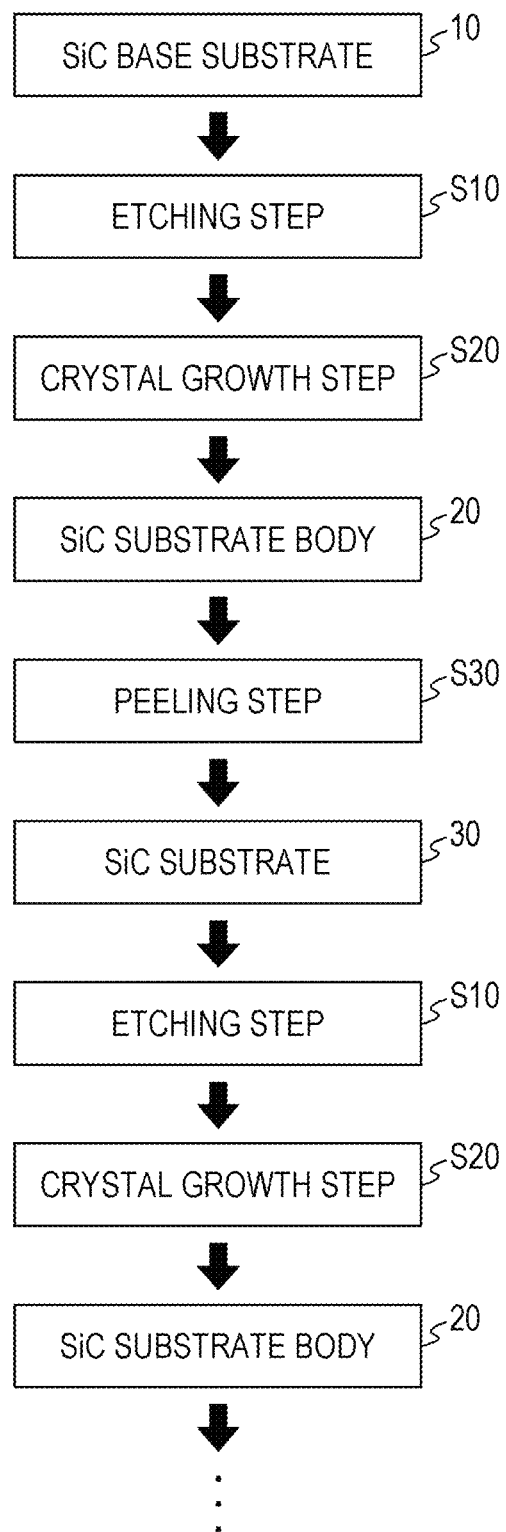
FIG. 1 is a schematic diagram of a production step of a SiC substrate according to an embodiment.
Figure 2:
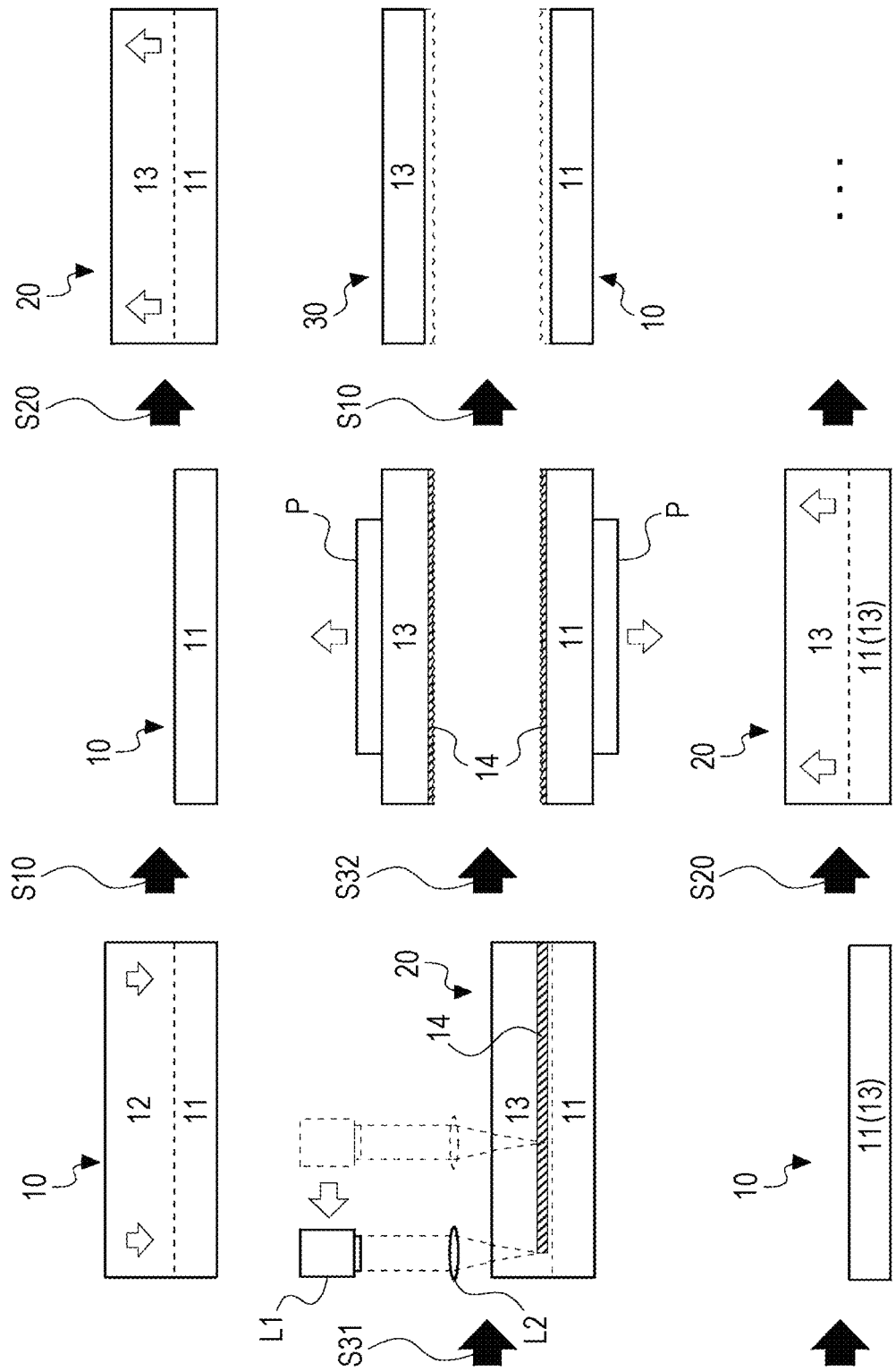
FIG. 2 is an explanatory diagram of a production step of a SiC substrate according to an embodiment.

As illustrated in FIGS. 1 and 2, the present invention is a method for producing a new SiC substrate 30 from a SiC base substrate 10, and includes: an etching step S10 of removing an subsurface damaged layer 12 of the SiC base substrate 10 by etching; a crystal growth step S20 of growing a SiC substrate layer 13 on the SiC base substrate 10 to obtain a SiC substrate body 20; and a peeling step S30 of peeling a part of the SiC substrate body 20 to obtain the SiC substrate 30.

The etching step S10 and the crystal growth step S20 according to the present invention is a step of arranging the SiC base substrate 10 and the SiC material 40 so as to face each other, and performing heating so as to form a temperature gradient between the SiC base substrate 10 and the SiC material 40. By performing heating as described above, the subsurface damaged layer 12 can be removed in the etching step S10, and the SiC substrate layer 13 can be grown in the crystal growth step S20.

Hereinafter, each step of the present invention will be described in detail.

<Etching Step>

Figure 3:
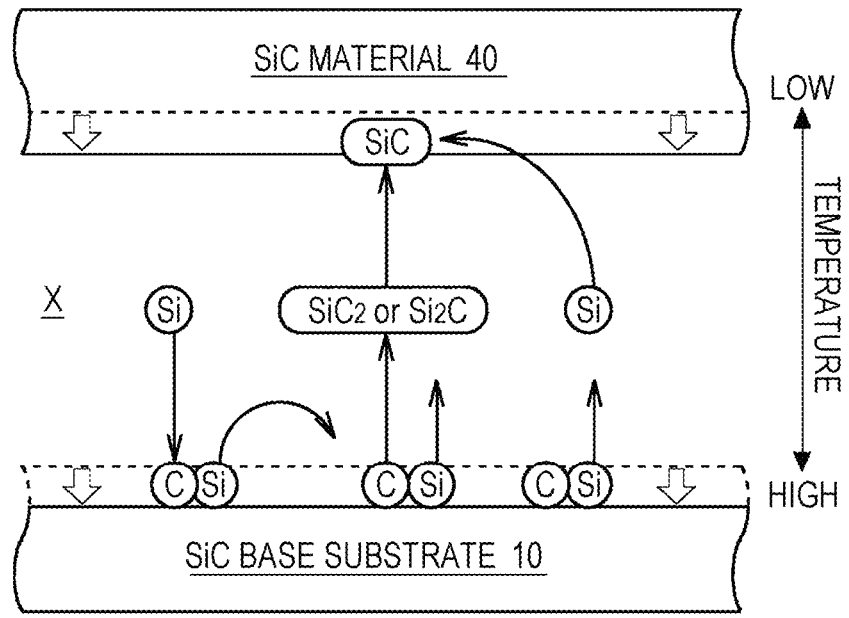
FIG. 3 is an explanatory diagram illustrating an outline of an etching step of the present invention.

As illustrated in FIG. 3, the etching step S10 is a step of arranging the SiC base substrate 10 and the SiC material 40 so as to face each other and performing heating to transport source materials (Si element, C element and dopant) from the SiC base substrate 10 to the SiC material 40 and etch a surface of the SiC base substrate 10.

In this etching step S10, it is preferable that the SiC base substrate 10 and the SiC material 40 are arranged in a semi-closed space and heating is performed. This semi-closed space can be formed, for example, by accommodation in the main container 50 as described later.

The "semi-closed space" in the present specification refers to a space in which at least part of steam generated in the container can be confined, although the inside of the container can be evacuated.

(SiC Base Substrate)

Examples of the SiC base substrate 10 include a single crystal SiC processed into a plate. Specifically, examples thereof include a SiC wafer or the like obtained by slicing a SiC ingot produce by a sublimation method or the like into a disk shape. As the crystal polymorphism of single crystal SiC, any polytype can be adopted.

Further, the SiC substrate 30 produced by the method for producing a SiC substrate according to the present invention can also be used as the SiC base substrate.

In general, the SiC base substrate 10 that has been subjected to mechanical processing (for example, slicing or grinding and polishing) or laser processing includes an subsurface damaged layer 12 in which subsurface damage such as a scratch, a latent scratch, and strain has been introduced, and a bulk layer 11 in which no such subsurface damage has been introduced (see FIG. 2).

The presence or absence and depth of this subsurface damaged layer 12 can be checked by the SEM-EBSD method, TEM, μXRD, Raman spectroscopy, or the like. In order to produce a high-quality SiC base substrate 10, it is preferable to remove the subsurface damaged layer 12 to expose the bulk layer 11 to which no subsurface damage has been introduced.

A step-terrace structure is confirmed on the surface of the SiC base substrate 10 and the SiC substrate 30 flattened at the atomic level. This step-terrace structure is a staircase structure in which step that is a stepped portion of one or more molecular layers, and terrace, that is a flat portion where a {0001} surface is exposed are alternately arranged.

In the step, one molecular layer (0.25 nm) is the minimum height (minimum unit), and various step heights are formed by overlapping a plurality of the single molecular layers. In the description of the present specification, the step that has become huge by bunching and has a height exceeding one unit cell of each polytype is referred to as macro-step bunching (MSB).

That is, the MSB refers to a step obtained by bunching of greater than four molecular layers (equal to or greater than five molecular layers) in the case of 4H—SiC. The MSB refers to a step obtained by bunching of greater than six molecular layers (equal to or greater than seven molecular layers) in the case of 6H—SiC.

It is desirable that this MSB is not formed on the surface of the SiC base substrate 10 because defects caused by MSB may occur when crystal growth is performed.

It is sufficient that the dopant is an element that is generally doped in the SiC substrate. Specifically, nitrogen (N), phosphorus (P), aluminum (Al), boron (B) and the like are preferable.

The doping concentration of the SiC base substrate 10 is preferably higher than $1\times10^{17}$ cm$^{-3}$, more preferably equal to or higher than $1\times10^{18}$ cm$^{-3}$, and further preferably equal to or higher than $1\times10^{19}$ cm$^{-3}$.

The dopant and doping concentration can be checked by Raman spectroscopy or secondary ion mass spectrometry (SIMS).

(Sic Material)

The SiC material 40 is composed of SiC that can supply Si element, C element, and dopant to the SiC base substrate 10 by heating the SiC material 40 so as to face the SiC base substrate 10. Examples include a container made of SiC (main container 50) and a substrate made of SiC. Specifically, for example, at least a part (particularly, the portion facing the SiC base substrate 10) of the container for accommodating the SiC base substrate 10 is formed of the SiC material 40, or a SiC substrate as the SiC material 40 is arranged so as to face the SiC base substrate 10 in the container.

That is, the SiC material 40 is preferably single crystal SiC or polycrystalline SiC. As the crystal polymorph of the SiC material 40, any polytype can be adopted.

As the dopant, the same elements as those of the SiC base substrate 10 can be adopted. Specifically, nitrogen (N), phosphorus (P), aluminum (Al), boron (B) and the like are preferable.

It is sufficient that the doping concentration of the SiC material 40 is set to the doping concentration of the SiC substrate 30 to be produced. For example, when it is desired to produce a SiC substrate 30 having a high doping concentration, the doping concentration of the SiC material 40 may be preferably greater than $1\times10^{17}$ cm$^{-3}$, and more preferably equal to or greater than $1\times10^{18}$ cm$^{-3}$, further more preferably equal to or greater than $1\times10^{19}$ cm$^{-3}$.

On the other hand, when it is desired to produce a SiC substrate 30 having a high doping concentration, the doping concentration of the SiC material 40 may be preferably equal to or less than $1\times10^{17}$ cm$^{-3}$, and more preferably equal to or less than $1\times10^{16}$ cm$^{-3}$, further more preferably equal to or less than $1\times10^{15}$ cm$^{-3}$.

The dopant and doping concentration can be checked by Raman spectroscopy or secondary ion mass spectrometry (SIMS).

(Semi-Closed Space)

The semi-closed space may be configured so that the atomic number ratio Si/C is equal to or less than 1. For example, the SiC base substrate 10 satisfying a stoichiometric ratio 1:1 is arranged in a main container 50 made of SiC satisfying a stoichiometric ratio 1:1, the atomic number ratio Si/C in the main container 50 is 1 (see FIG. 7). A C vapor supply source (C pellet or the like) may be arranged to set the atomic number ratio Si/C to equal to or less than 1.

The semi-closed space may be configured so that the atomic number ratio Si/C is greater than 1. For example, the SiC base substrate 10 satisfying a stoichiometric ratio 1:1 and a Si-vapor supply source 55 (Si pellet or the like) are arranged in the main container 50 made of SiC satisfying a stoichiometric ratio 1:1, the atomic number ratio Si/C in the main container 50 exceeds 1 (see FIG. 6).

(Outline of Etching Step)

FIG. 3 is an explanatory diagram illustrating an outline of the etching step S10. In this etching step S10, it is considered that, by arranging the SiC base substrate 10 in a semi-closed space where the SiC material 40 is exposed, and performing heating in a temperature range of 1400° C. or higher and 2300° C. or lower, the reactions 1) to 5) below are performed continuously, and as a result, the etching proceeds.

1) $SiC(s) \rightarrow Si(v) + C(s)$
2) $2C(s) + Si(v) \rightarrow SiC_2(v)$
3) $C(s) + 2Si(v) \rightarrow Si_2C(v)$
4) $Si(v) + SiC_2(v) \rightarrow 2SiC(s)$
5) $Si_2C(v) \rightarrow Si(v) + SiC(s)$ Explanation of 1): When the SiC base substrate 10 (SiC(s)) is heated, Si atoms (Si(v)) are desorbed from the surface of the SiC base substrate 10 by thermal decomposition (Si atom sublimation step).

Explanation of 2) and 3): C (C(s)) remaining on the surface of the SiC base substrate 10 due to the desorption of Si atom (Si(v)) reacts with Si vapor (Si(v)) in the semi-closed space. As a result, C (C(s)) becomes $Si_2C$, $SiC_2$, or the like and sublimates from the surface of the SiC base substrate 10 (C atom sublimation step).

Explanation of 4) and 5): Sublimated $Si_2C$, $SiC_2$, or the like reaches the SiC material 40 in the semi-closed space and performs crystal growth due to the temperature gradient.

As described above, the etching step S10 includes: a Si atom sublimation step of thermally sublimating the Si atom from the surface of the SiC base substrate 10; and a C atom sublimation step of causing the C atom remaining on the surface of the SiC base substrate 10 to react with the Si vapor in the semi-closed space to sublimate the C atom from the surface of the SiC base substrate 10.

In other words, the etching step S10 is a step of arranging the SiC base substrate 10 and the SiC material 40 so as to face each other, and performing heating so that the SiC base substrate 10 is on the high temperature side and the SiC material 40 is on the low temperature side. As a result, an etching space X is formed between the SiC base substrate 10 and the SiC material 40, and the surface of the SiC base substrate 10 can be etched using the temperature gradient as a driving force.

The etching step S10 includes a step of arranging the SiC base substrate 10 and the SiC material 40 so as to face each other in a semi-closed space having an atomic number ratio Si/C of greater than 1, and performing heating so that the SiC base substrate 10 is on the high temperature side and the SiC material 40 is on the low temperature side.

As described above, the subsurface damaged layer 12 can be removed and MSB can be removed by etching the surface of the SiC base substrate 10 in a semi-closed space having an atomic number ratio of Si/C of greater than 1.

<Crystal Growth Step>

Figure 4:
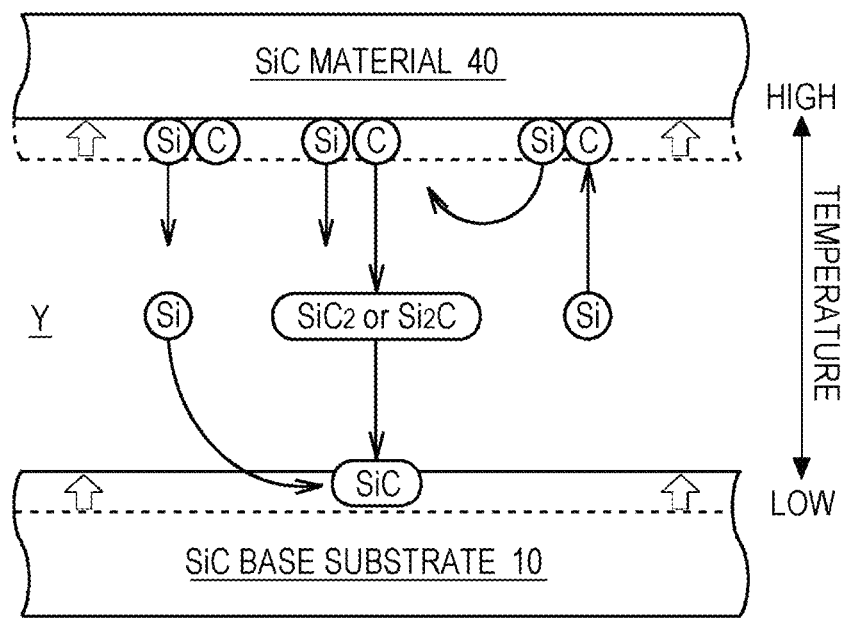
FIG. 4 is an explanatory diagram illustrating an outline of a crystal growth step of the present invention.

As illustrated in FIG. 4, the crystal growth step S20 is a step of arranging the SiC base substrate 10 and the SiC material 40 so as to face each other and performing heating to transport source materials (Si element, C element and dopant) from the SiC material 40 to the SiC base substrate 10 and grow the SiC substrate layer 13. By this crystal growth step S20, the SiC substrate body 20 obtained by growing the SiC substrate layer 13 on the SiC base substrate 10 is obtained.

In the crystal growth step S20, as similar to the etching step S10, it is preferable that the SiC base substrate 10 and the SiC material 40 are arranged in a semi-closed space and heating is performed. This semi-closed space is formed, for example, by accommodation in the main container 50.

(Outline of Crystal Growth Step)

FIG. 4 is an explanatory diagram illustrating an outline of the crystal growth step S20. In this crystal growth step S20, it is considered that, by arranging the SiC base substrate 10 in a semi-closed space where the SiC material 40 is exposed, and performing heating in a temperature range of 1400° C. or higher and 2300° C. or lower, the reactions 1) to 5) below are performed continuously, and as a result, the crystal growth proceeds.

1) $Poly\text{-}SiC(s) \rightarrow Si(v) + C(s)$
2) $2C(s) + Si(v) \rightarrow SiC_2(v)$
3) $C(s) + 2Si(v) \rightarrow Si_2C(v)$
4) $Si(v) + SiC_2(v) \rightarrow 2SiC(s)$
5) $Si_2C(v) \rightarrow Si(v) + SiC(s)$ Explanation of 1): When the SiC material (Poly-SiC(s)) is heated, Si atoms (Si(v)) are desorbed from SiC by thermal decomposition.

Explanation of 2) and 3): C (C(s)) remaining due to the desorption of Si atom (Si(v)) reacts with Si vapor (Si(v)) in the semi-closed space. As a result, C (C(s)) becomes $Si_2C$, $SiC_2$, or the like and sublimates into the semi-closed space.

Explanation of 4) and 5): Sublimated $Si_2C$, $SiC_2$, or the like reaches and diffuses to the terrace of SiC base substrate 10 due to the temperature gradient (or chemical potential difference), and reaches the step to grow while inheriting the polymorphisms of the SiC base substrate 10 that is a base (step flow growth).

As described above, the crystal growth step S20 includes: a Si atom sublimation step of thermally sublimating the Si atom from the surface of the SiC material 40; a C atom sublimation step of sublimating the C atom remaining on the surface of the SiC material 40 by causing the C atom to react with the Si vapor in the semi-closed space; a source material transporting step of transporting the source material to the surface of the SiC base substrate 10 using the temperature gradient or the chemical potential difference as the driving force; and a step flow growth step in which the source material reaches the step of the SiC base substrate 10 to grow.

The source material referred to here includes Si element, C element and a dopant. Therefore, the dopant of the SiC material 40 is transported together with the Si element and the C element. As a result, the SiC substrate layer 13 grows while inheriting the doping concentration of the SiC material 40.

Therefore, when it is desired to obtain a SiC substrate 30 having a specific doping concentration, the SiC substrate 30 having a desired doping concentration can be produced by adopting the SiC material 40 having a desired doping concentration.

In other words, the crystal growth step S20 is a step of arranging the SiC base substrate 10 and the SiC material 40 so as to face each other, and performing heating so that the SiC base substrate 10 is on the low temperature side and the SiC material 40 is on the high temperature side. As a result, a crystal growth space Y is formed between the SiC base substrate 10 and the SiC material 40, and the SiC base substrate 10 can be grown by using the temperature gradient as a driving force.

The crystal growth step S20 includes a step of arranging the SiC base substrate 10 and the SiC material 40 so as to face each other in a semi-closed space having an atomic number ratio Si/C of greater than 1, and performing heating so that the SiC base substrate 10 is on the low temperature side and the SiC material 40 is on the high temperature side.

As described above, it is possible to suppress the formation of MSB on the surface of the SiC substrate layer 13 by crystal growth in a semi-closed space having an atomic number ratio Si/C of greater than 1.

The crystal growth step S20 includes a step of arranging the SiC base substrate 10 and the SiC material 40 so as to face each other in a semi-closed space having an atomic number ratio Si/C of equal to or less than 1, and performing heating so that the SiC base substrate 10 is on the low temperature side and the SiC material 40 is on the high temperature side.

As described above, by crystal growth in a semi-closed space having an atomic number ratio Si/C of equal to or less than 1, basal plane dislocation (BPD) in the SiC substrate layer 13 can be removed or reduced.

When a single crystal SiC is used for the SiC base substrate 10 and a polycrystalline SiC is used for the SiC material 40, crystal growth can be performed by using a partial pressure difference (chemical potential difference) generated on the surface of the polycrystalline SiC and the single crystal SiC as a driving force of transportation of a source material.

<Peeling Step>

The peeling step S30 is a step of peeling a part of the SiC substrate body 20 obtained in the crystal growth step S20 to obtain the SiC substrate 30. Examples of means of peeling the SiC substrate 30 include a multi-wire saw cutting of cutting by reciprocating a plurality of wires, an electric discharge machining method of cutting by intermittently generating a plasma discharge, and a technique of cutting using a laser that emits and condenses a laser beam in the crystal to form a layer serving as a base point for cutting.

Above all, it is preferable to adopt the technique of using a laser with less material loss. Hereinafter, the technique of peeling using a laser will be described in detail.

The peeling step S30 according to the present embodiment includes a laser irradiation step S31 of introducing a damaged layer 14 into the SiC substrate body 20 and a separation step S32 of performing separation with the damaged layer 14 as a starting point.

The laser irradiation step S31 is a step of positioning a focusing point of a laser beam having a wavelength that is transparent to single crystal SiC to the inside the SiC substrate body 20, and irradiating the SiC substrate body 20 with the laser beam to form the damaged layer 14. (see FIG. 2).

Laser irradiation means L used in the laser irradiation step S31 includes, for example, a laser light source L1 that pulse-oscillates a laser beam and a condensing lens L2 for condensing the laser light. By scanning this laser beam, the damaged layer 14 is introduced into the SiC substrate body 20.

The separation step S32 is a step of peeling the SiC substrate 30 from the SiC substrate body 20 along the damaged layer 14 by wafer peeling means P. As illustrated in FIG. 2, examples of the wafer peeling means P include a method of adsorbing the front surface and the rear surface of the SiC substrate body 20 to a pedestal or the like to perform separation. Further, peeling may performed by reciprocating a thin wire along the damaged layer 14, or peeling may be performed with the damaged layer 14 as a starting point by applying ultrasonic vibration.

Known technologies can be adopted for the laser irradiation step S31 and the separation step S32. For example, technologies disclosed in JP 2013-49161 A, JP 2018-207034 A, JP 2017-500725 A, and JP 2017-526161 A can be adopted.

The SiC substrate 30 can be produced from the SiC base substrate 10 by performing the etching step S10, the crystal growth step S20, and the peeling step S30 as described above. In FIG. 2, one SiC substrate 30 is peeled off from one SiC base substrate 10, but a plurality of SiC substrates 30 may be peeled off by forming the SiC substrate layer 13 thickly.

The SiC substrate 30 can be repeatedly produced by subjecting the SiC base substrate 10 from which the SiC substrate 30 has been peeled off to the etching step S10 or the peeling step S30.

It is also possible to produce a new SiC substrate 30 by using the SiC substrate 30 (SiC substrate layer 13) peeled off from the SiC substrate body 20.

That is, a method for producing a SiC substrate according to another embodiment further includes an etching step S10 of removing an subsurface damaged layer of the SiC substrate layer 13 that has been peeled, a crystal growth step S20 of growing another SiC substrate layer 13 on the SiC substrate layer 13 to obtain a SiC substrate body 20, and a peeling step S30 of peeling a part of the SiC substrate body 20.

As described above, by using the produced SiC substrate 30 as the SiC base substrate 10, it is possible to further produce the SiC substrate 30.

The damaged layer 14 remains on the SiC base substrate 10 and the SiC substrate 30 after peeling. Therefore, as illustrated in FIG. 2, the damaged layer 14 (subsurface damaged layer) may be removed by subjecting the SiC base substrate 10 and the SiC substrate 30 after peeling to the etching step S10.

When waviness is formed on the surfaces of the SiC base substrate 10 and the SiC substrate 30 after peeling, the waviness may be removed by performing a mechanical polishing step such as a lapping step.

According to the method for producing a SiC substrate according to the present invention, heat treatment of the SiC base substrate 10 is performed in the same environment (apparatus system) in the etching step S10 and the crystal growth step S20. In conventional technologies, it is necessary to separately introduce or outsource an apparatus for performing CMP polishing for removing the subsurface damaged layer 12 and an apparatus for performing crystal growth. According to the present invention, since a plurality of steps can be performed by one device system, the cost can be significantly reduced.

When the etching step S10 and the crystal growth step S20 are performed using the same SiC material 40, the source materials consumed in the crystal growth step S20 are filled in the etching step S10. Therefore, the life of the SiC material 40 can be extended.

According to the crystal growth step S20 according to the present invention, the SiC substrates 30 having desired specifications can be produced one by one (or by a small number each time). Therefore, a small number of SiC substrates 30 having a desired doping concentration can be produced each time. Furthermore, by selecting the SiC material 40, it is possible to control the doping concentration one by one for production.

According to the crystal growth step S20 according to the present invention, it is sufficient to grow the thickness of the SiC substrate layer 13, so that it is easy to maintain the environment for forming the high-quality SiC substrate 30. That is, a high-quality SiC substrate 30 can be produced with less material loss as compared with the case of forming an ingot whose growth point changes each time the growth progresses (sublimation method).

Further, since the temperature gradient is provided along the direction in which the SiC base substrate 10 and the SiC material 40 face each other, it is possible to easily control the temperature distribution in the plane of the SiC base substrate 10 to be substantially uniform. Therefore, it is possible to produce a SiC substrate having a large diameter such as equal to or greater than six inches or equal to or greater than eight inches.

<<SiC Substrate Production Apparatus>>

A production apparatus for achieving the method for producing a SiC substrate according to the present invention will be described in detail below. In this embodiment, the components that are basically the same as the components shown in the above production method are designated by the same reference numerals to simplify the description.

Figure 5:
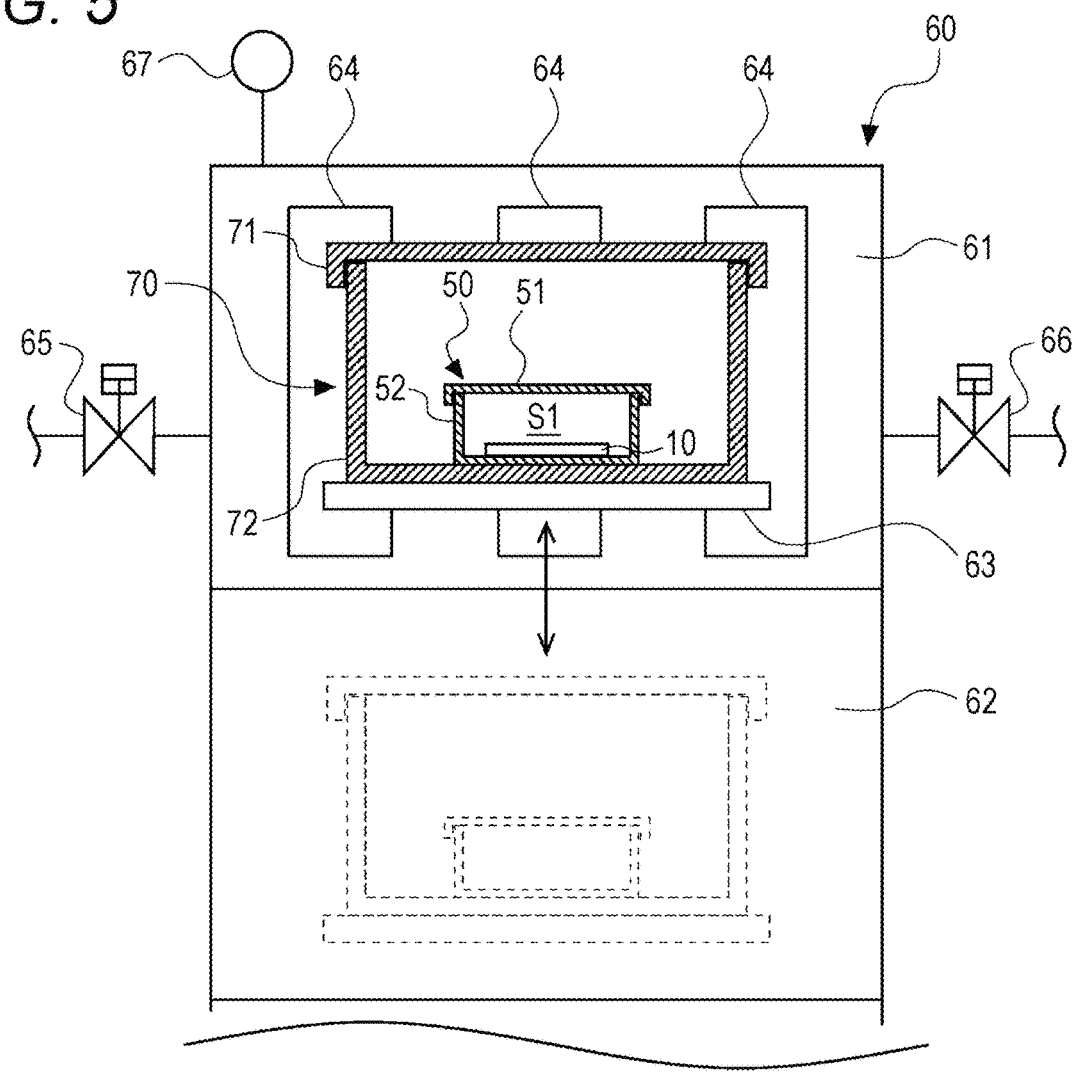
FIG. 5 is an explanatory diagram of a SiC substrate production apparatus according to an embodiment.

As illustrated in FIG. 5, the SiC substrate production apparatus according to the present embodiment includes: the main container 50 capable of accommodating the SiC base substrate 10 and containing the SiC material 40; and a heating furnace 60 that can be heated so as to form a temperature gradient between the SiC base substrate 10 and the SiC material 40.

(Main Container)

The main container 50 is a fitting container including an upper container 51 and a lower container 52 that can be fitted to each other. A minute gap 53 is formed in a fitting portion between the upper container 51 and the lower container 52, and the main container 50 is configured so that air exhausting (evacuation) in the main container 50 can be performed from this gap 53.

The main container 50 includes a SiC material 40 arranged so as to face the SiC base substrate 10, and a source material transport space S1 for transporting a source material between the SiC material 40 and the SiC base substrate 10. The doping concentration of the SiC material 40 is preferably set to a doping concentration corresponding to the desired SiC substrate 30.

The upper container 51 and the lower container 52 according to the present embodiment are made of polycrystalline SiC. Therefore, the main container 50 itself becomes the SiC material 40. Only the portion of the main container 50 facing the SiC base substrate 10 may be made of the SiC material 40. In that case, a refractory material (similar to the refractory material container 70 described later) can be used for the portion other than the SiC material 40.

Although not illustrated, a configuration may be adopted in which a refractory material is adopted for the entire main container 50 and a substrate-shaped SiC material 40 is separately accommodated. In that case, a spacer (a substrate holder 54 as described later or the like) may be arranged between the substrate-shaped SiC material 40 and the SiC base substrate 10 to form an etching space X or a crystal growth space Y.

That is, the main container 50 is configured to generate an atmosphere containing Si element and C element in the internal space when the heat treatment is performed in the state where the SiC base substrate 10 is accommodated. In the present embodiment, the main container 50 made of polycrystalline SiC is heated to form an atmosphere containing Si element and C element in the internal space.

It is desirable that the space inside the heat-treated main container 50 is a vapor pressure environment of a mixed system of gas phase species containing Si element and gas phase species containing C element. Examples of the gas phase species containing the Si element include Si, $Si_2$, $Si_3$, $Si_2C$, $SiC_2$, and SiC. Examples of the gas phase species containing the C element include $Si_2C$, $SiC_2$, SiC, and C. That is, it is preferable that the SiC gas exists in a semi-closed space.

The source material transport space S1 is a space for transporting source materials from the SiC base substrate 10 to the SiC material 40 by using a temperature gradient provided between the SiC base substrate 10 and the SiC material 40 as a driving force, and is a space for transporting source materials from the SiC material 40 to the SiC base substrate 10.

Figure 6:
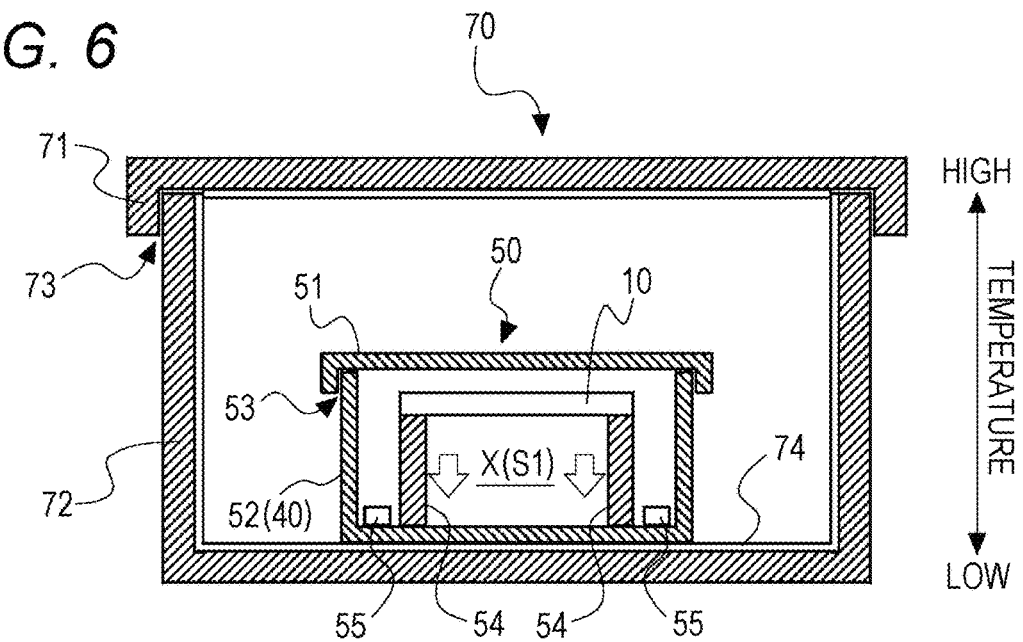
FIG. 6 is a schematic diagram of a main container and a refractory material container according to an embodiment.

For example, consider a case where the SiC base substrate 10 is arranged so that, when comparing the temperature of the surface of the SiC base substrate 10 with the temperature of the SiC material 40 facing this surface, the temperature of the SiC base substrate 10 side is high and the temperature of the upper container 51 is low (see FIG. 6). As described above, when the SiC base substrate 10 and the SiC material 40 are arranged so as to face each other and heating is performed so that the SiC base substrate 10 is on the high temperature side and the SiC material 40 is on the low temperature side, the source material is transported from the SiC base substrate 10 to the SiC material 40, and the SiC base substrate 10 is etched. That is, by setting such a temperature gradient and performing heating, an etching space X is formed in the source material transport space S1.

As illustrated in FIG. 6, the main container 50 may include a substrate holder 54 for arranging the SiC base substrate 10 on the high temperature side of the temperature gradient. As described above, by providing the substrate holder 54, the SiC base substrate 10 can be arranged on the high temperature side of the temperature gradient formed by the heating furnace 60 to form the etching space X of the SiC base substrate 10. It is desirable that the substrate holder 54 is made of the same refractory material as the refractory material container 70.

Figure 7:
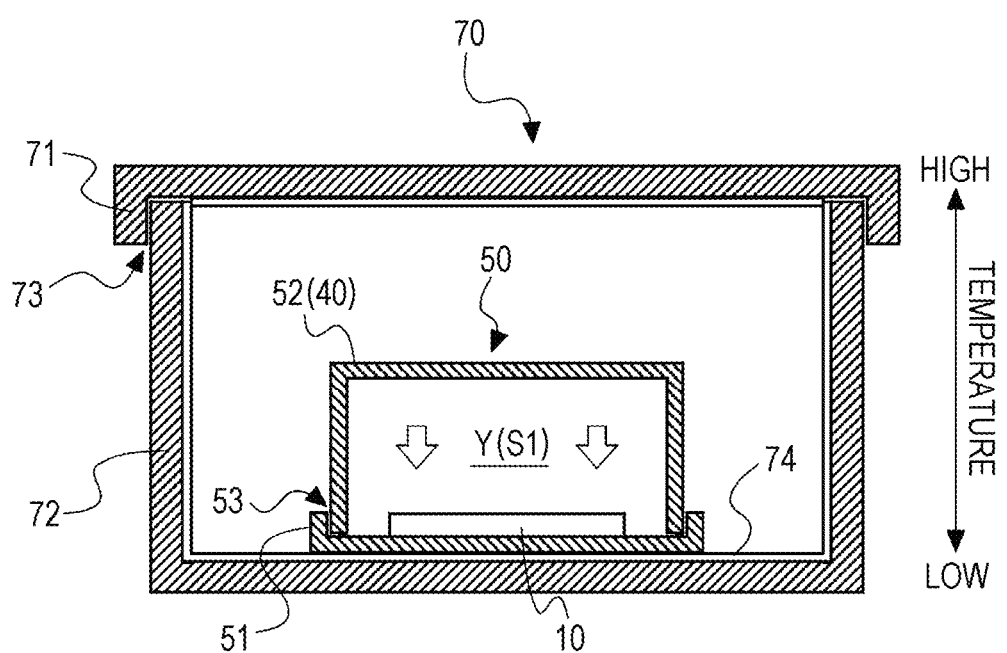
FIG. 7 is a schematic diagram of a main container and a refractory material container according to an embodiment.

On the other hand, consider a case where the SiC base substrate 10 is arranged so that, when comparing the temperature of the surface of the SiC base substrate 10 with the temperature of the SiC material 40 facing this surface, the temperature of the SiC base substrate 10 side is low and the temperature of the upper container 51 is high (see FIG. 7). As described above, when the SiC base substrate 10 and the SiC material 40 are arranged so as to face each other and heating is performed so that the SiC base substrate 10 is on the low temperature side and the SiC material 40 is on the high temperature side, the source material is transported from the SiC material 40 to the SiC base substrate 10, and the SiC substrate layer 13 is grown on the SiC base substrate 10. That is, by setting such a temperature gradient and performing heating, a crystal growth space Y is formed in the source material transport space S1.

That is, the configuration illustrated in FIG. 6 is the etching step S10 of the method for producing the SiC substrate of the present invention, and the configuration illustrated in FIG. 7 is the crystal growth step S20. At this time, crystal growth of the SiC material 40 is performed in the etching step S10, and the SiC material 40 is etched in the crystal growth step S20. Therefore, in the etching step S10 and the crystal growth step S20, it is preferable that the SiC material 40 facing the SiC base substrate 10 is a part.

Specifically, in the etching step S10 of FIG. 6, crystal growth of the lower container 52 is performed. Therefore, in the crystal growth step S20 of FIG. 7, it is preferable that the lower container 52 is arranged on the high temperature side of the temperature gradient, and the material is supplied to the SiC base substrate 10. As described above, by etching the grown portion of the SiC material 40 in the etching step S10 in the crystal growth step S20, the life of the SiC material 40 can be extended.

Although FIGS. 6 and 7 illustrate an example of reversing the state of the main container 50, it is also possible to use the same portion of the SiC material 40 by reversing the temperature gradient of the heating furnace 60.

Further, as illustrated in FIG. 6, the main container 50 may be provided with a Si-vapor supply source 55 capable of supplying Si vapor in the container. Examples of the Si-vapor supply source 55 include solid Si (a single crystal Si piece or a Si pellet of Si powder or the like) and a Si compound.

For example, when the entire main container 50 is composed of polycrystalline SiC as in the present embodiment, by arranging the Si-vapor supply source 55, the atomic number ratio Si/C in the main container 50 is greater than 1.

Specifically, the SiC base substrate 10 satisfying a stoichiometric ratio 1:1 and a Si-vapor supply source 55 (Si pellet or the like) are arranged in the main container 50 made of polycrystalline SiC satisfying a stoichiometric ratio 1:1, the atomic number ratio Si/C in the main container 50 exceeds 1.

As described above, by heating the space where the atomic number ratio Si/C is greater than 1, the environment can be approached to the environment of the vapor pressure when SiC (solid) and Si (liquid phase) are in a phase equilibrium state via the gas phase (SiC—Si equilibrium vapor pressure environment).

On the other hand, when the Si-vapor supply source is not provided in the main container 50, the atomic number ratio Si/C in the main container 50 is 1 or equal to or less than 1.

Specifically, the SiC base substrate 10 satisfying a stoichiometric ratio 1:1 are arranged in the main container 50 made of polycrystalline SiC satisfying a stoichiometric ratio 1:1, the atomic number ratio Si/C in the main container 50 is 1.

As described above, by heating the space where the atomic number ratio Si/C is 1 or equal to or less than 1, the environment can be approached to the environment of the vapor pressure when SiC (solid phase) and C (solid phase) are in a phase equilibrium state via the gas phase (SiC—C equilibrium vapor pressure environment).

The SiC—Si equilibrium vapor pressure environment and the SiC—C equilibrium vapor pressure environment in the present specification include a near-thermal equilibrium vapor pressure environment that satisfies the relationship between the growth rate and the growth temperature derived from the theoretical thermal equilibrium environment.

(Heating Furnace)

As illustrated in FIG. 5, the heating furnace 60 includes: a main heating chamber 61 capable of heating an object to be treated (SiC base substrate 10 or the like) to a temperature of equal to or higher than 1000° C. and equal to or less than 2300° C.; a preheating chamber 62 capable of preheating the object to be treated to a temperature of equal to or higher than 500° C.; a refractory material container 70 capable of accommodating the main container 50; and moving means 63 (moving table) capable of moving the refractory material container 70 from the preheating chamber 62 to the main heating chamber 61.

The main heating chamber 61 is formed in a regular hexagonal shape in a plan sectional view, and the refractory material container 70 is arranged inside the main heating chamber 61.

A heater 64 (mesh heater) is provided inside the main heating chamber 61. A multilayer heat-reflecting metal plate is fixed to a side wall and ceiling of the main heating chamber 61 (not illustrated). This multilayer heat-reflecting metal plate is configured to reflect the heat of the heater 64 toward a substantially central portion of the main heating chamber 61.

As a result, in the main heating chamber 61, the heater 64 is arranged so as to surround the refractory material container 70 accommodating the object to be treated, and further, the multilayer heat-reflecting metal plate is arranged outside the heater 64, so that the temperature can be raised to equal to or higher than 1000° C. and equal to or less than 2300° C.

As the heater 64, for example, a resistance heating type heater or a high frequency induction heating type heater can be used.

As a configuration of the heater 64, a configuration capable of forming a temperature gradient in the refractory material container 70 may be adopted. For example, the heater 64 may be configured so that many heaters are arranged on the upper side. Further, the heater 64 may be configured so that the width increases toward the upper side. Alternatively, the heater 64 may be configured so that the electric power supplied can be increased toward the upper side.

To the main heating chamber 61, a vacuum forming valve 65 that performs air exhausting in the main heating chamber 61, an inert gas injection valve 66 that introduces an inert gas into the main heating chamber 61, a vacuum gauge 67 that measures the degree of vacuum in the main heating chamber 61 are connected.

The vacuum forming valve 65 is connected to an evacuation pump that exhausts and evacuates the inside of the main heating chamber 61 (not illustrated). With the vacuum forming valve 65 and the evacuation pump, the degree of vacuum in the main heating chamber 61 can be adjusted to, for example, equal to or less than 10 Pa, more preferably equal to or less than 1 Pa, still more preferably equal to or less than $10^{-3}$ Pa. Examples of this evacuation pump include a turbo molecular pump.

The inert gas injection valve 66 is connected to an inert gas supply source (not illustrated). With the inert gas injection valve 66 and the inert gas supply source, inert gas can be introduced into the main heating chamber 61 in the range of $10^{-3}$ to 10000 Pa. As this inert gas, Ar, He, $N_2$ and the like can be selected.

The inert gas injection valve 66 is dopant gas supply means capable of supplying the dopant gas into the main container 50. That is, the doping concentration of the SiC substrate layer 13 can be adjusted by selecting a dopant gas (for example, $N_2$ or the like) as the inert gas.

The preheating chamber 62 is connected to the main heating chamber 61, and is configured so the refractory material container 70 can be moved by the moving means 63. The preheating chamber 62 of the present embodiment is configured so that the temperature can be raised by the residual heat of the heater 64 of the main heating chamber 61. For example, when the temperature of the main heating chamber 61 is raised to 2000° C., the temperature of the preheating chamber 62 is raised to about 1000° C., and the object to be treated (SiC base substrate 10, main container 50, refractory material container 70, or the like) can be degassed.

The moving means 63 is configured to be movable between the main heating chamber 61 and the preheating chamber 62 on which the refractory material container 70 is placed. Since the transportation between the main heating chamber 61 and the preheating chamber 62 by the moving means 63 is completed in about one minute at the shortest, it is possible to raise or lower the temperature at 1 to 1000° C./min.

As described above, since the temperature can rapidly raises and lowered, it is possible to observe a surface shape that does not have a history of low-temperature growth during raising and lowering, which is difficult with conventional apparatuses.

In FIG. 3, the preheating chamber 62 is arranged below the main heating chamber 61, but the present invention is not limited to this, and the preheating chamber 62 may be arranged in any direction.

The moving means 63 according to the present embodiment is a moving table on which the refractory material container 70 is placed. A small amount of heat is released from the contact portion between the moving table and the refractory material container 70. As a result, a temperature gradient can be formed in the refractory material container 70 (and the main container 50).

That is, in the heating furnace 60 of the present embodiment, since the bottom of the refractory material container 70 is in contact with the moving table, a temperature gradient is provided so that the temperature decreases from the upper container 71 to the lower container 72 of the refractory material container 70. It is desirable that this temperature gradient is formed along the front and back direction of the SiC base substrate 10.

As described above, a temperature gradient may be formed depending on the configuration of the heater 64. With the heater 64, a configuration in which the temperature gradient is reversed may be adopted.

(Refractory Material Container)

It is preferable that the heating furnace 60 forms an atmosphere containing the Si element, and the main container 50 can be heated in this atmosphere. The atmosphere containing the Si element in the heating furnace 60 according to the present embodiment is formed by using the refractory material container 70 and the Si-vapor supply source 74.

Any method capable of forming an atmosphere containing Si element around the main container 50 can be adopted of course.

The refractory material container 70 includes a high melting point material. Examples of such refractory material include C that is a general-purpose heat-resistant member, W, Re, Os, Ta, and Mo that are refractory metals, $Ta_9C_8$, HfC, TaC, NbC, ZrC, $Ta_2C$, TiC, WC, and MoC that are carbides, HfN, TaN, BN, $Ta_2N$, ZrN, and TiN that are nitrides, and $HfB_2$, $TaB_2$, $ZrB_2$, $NB_2$, $TiB_2$, and polycrystalline SiC that are borides.

As similar to the main container 50, the refractory material container 70 is a fitting container including an upper container 71 and a lower container 72 that can be fitted to each other, and is configured to be able to accommodate the main container 50. A minute gap 73 is formed in the fitting portion between the upper container 71 and the lower container 72, and is configured so that air exhausting (evacuation) in the refractory material container 70 from this gap 73.

It is preferable that the refractory material container 70 has a Si-vapor supply source 55 capable of supplying a vapor pressure of gas phase species containing Si element in the refractory material container 70. The Si-vapor supply source 55 may be configured to generate Si vapor in the refractory material container 70 during heat treatment, and examples thereof include solid Si (a single crystal Si piece or a Si pellet of Si powder or the like) and a Si compound.

In the apparatus for producing the SiC substrate according to the present embodiment, TaC is used as the material of the refractory material container 70, and tantalum silicide is used as the Si-vapor supply source 55. That is, as illustrated in FIG. 4, a tantalum silicide layer is formed inside the refractory material container 70, and a configuration is adopted in which Si vapor is supplied from the tantalum silicide layer into the container during heat treatment, thereby forming the Si vapor pressure environment.

In addition to this, any configuration can be adopted as long as a vapor pressure of a gas phase species containing Si element is formed in the refractory material container 70 during heat treatment.

EXAMPLE

The present invention will be described in more detail below with reference to Example 1, Example 2, Example 3, Example 4, Example 5, and Example 6.

Example 1 is an example for specifically explaining the removal or reduction of the subsurface damaged layer 12 in the etching step S10. Example 2 is an example for specifically explaining the removal or reduction of the MSB in the etching step S10. Example 3 is an example for specifically explaining the removal or reduction of the MSB in the crystal growth step S20. Example 4 is an example for specifically explaining the removal or reduction of the BPD in the crystal growth step S20. Examples 5 and 6 are examples for explaining control of the doping concentration in the crystal growth step S20.

Example 1: Removal or Reduction of Subsurface Damaged Layer in Etching Step

The SiC base substrate 10 was accommodated in the main container 50 and the refractory material container 70, and the heat treatment was performed under the following heat treatment conditions.

[SiC Base Substrate 10]
Polymorphism: 4H-SiC
Substrate size: Width 10 mm×Length 10 mm×Thickness 0.45 mm
Off direction and off angle: <11-20>direction and 4° off
Etched surface: (0001) surface
Subsurface damaged layer 12 depth: 5 μm
The depth of the subsurface damaged layer 12 was checked by the SEM-EBSD method. The subsurface damaged layer 12 can also be checked by TEM, ρXRD, and Raman spectroscopy.

[Main Container 50]
Material: Polycrystalline SiC
Container size: Diameter 60 mm×Height 4 mm
Substrate holder 54 material: Single crystal SiC
Distance between SiC base substrate 10 and bottom surface of main container 50: 2 mm
Atomic number ratio in container Si/C: equal to or less than 1

[Refractory Material Container 70]
Material: TaC
Container size: Diameter 160 mm×Height 60 mm
Si-vapor supply source 74 (Si compound): $TaSi_2$

[Heat Treatment Conditions]
The SiC base substrate 10 arranged under the above condition was heat-treated under the following conditions.
Heating temperature: 1800° C.
Heating time: 20 min
Etching amount: 5 μm Temperature gradient: 1° C./mm
Etching rate: 0.25 μm/min
Main heating chamber vacuum degree: $10^{-5}$ Pa

[Measurement of Subsurface Damaged Layer by SEM-EBSD Method]

The lattice strain of the SiC base substrate 10 can be obtained by comparing the lattice with a reference crystal lattice as a reference. As a means of measuring this lattice strain, for example, the SEM-EBSD method can be used. The SEM-EBSD method is a method (Electron Back Scattering Diffraction (EBSD)) that enables strain measurement of minute regions on the basis of the Kikuchi line diffraction pattern obtained by electron backscattering in a scanning electron microscope (SEM). In this method, the amount of lattice strain can be obtained by comparing the diffraction pattern of the reference crystal lattice as a reference with the diffraction pattern of the measured crystal lattice.

As the reference crystal lattice, for example, a reference point is set in a region where lattice strain is not considered to occur. That is, it is desirable to arrange the reference point in the region of the bulk layer 11. In general, it is a well-established theory that the depth of the subsurface damaged layer 12 is about 10 μm. Therefore, it is sufficient that the reference point is set at a position of the depth of about 20 to 35 μm, which is considered to be sufficiently deeper than the subsurface damaged layer 12.

Next, the diffraction pattern of the crystal lattice at this reference point is compared with the diffraction pattern of the crystal lattice of each measurement region measured at a pitch on the order of nanometers. This makes it possible to calculate the amount of lattice strain in each measurement region with respect to the reference point.

The case where a reference point that is considered to have no lattice strain is set as the reference crystal lattice has been described. However, it is also possible to use an ideal crystal lattice of single crystal SiC as the reference, or use a crystal lattice that occupies the majority (for example, equal to or greater than a half) of the measurement region surface as the reference.

By measuring whether lattice strain exists by this SEM-EBSD method, the presence or absence of the subsurface damaged layer 12 can be determined. That is, when subsurface damage such as a scratch, a latent scratch, and strain is introduced, lattice strain occurs in the SiC base substrate 10, and stress is observed by the SEM-EBSD method.

The subsurface damaged layer 12 existing on the SiC base substrate 10 of Example 1 before and after the etching step S10 was observed by the SEM-EBSD method. The results are shown in FIGS. 8(*a*) and 8(*b*).

In this measurement, the cross section of the SiC base substrate 10 before and after the etching step S10 of Example 1 was measured using a scanning electron microscope under the following conditions.

SEM device: Zeiss Merline
  EBSD analysis: OIM crystal orientation analyzer manufactured by TSL Solutions
  Acceleration voltage: 15 kV
  Probe current: 15 nA
  Step size: 200 nm
  Reference point R depth: 20 μm FIG. 8(*a*) is a cross-sectional SEM-EBSD captured image of the SiC base substrate 10 before the etching step S10 of Example 1.

Figure 8:
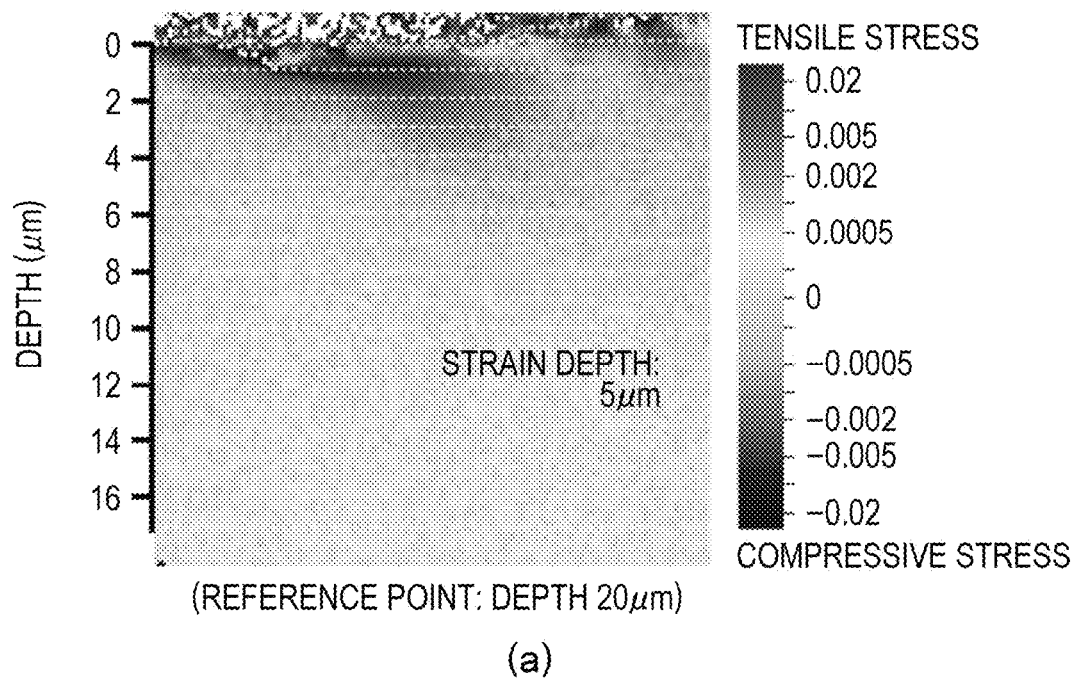
FIG. 8 is an explanatory diagram of a SiC base substrate obtained in the etching step of the present invention.
Figure 8:
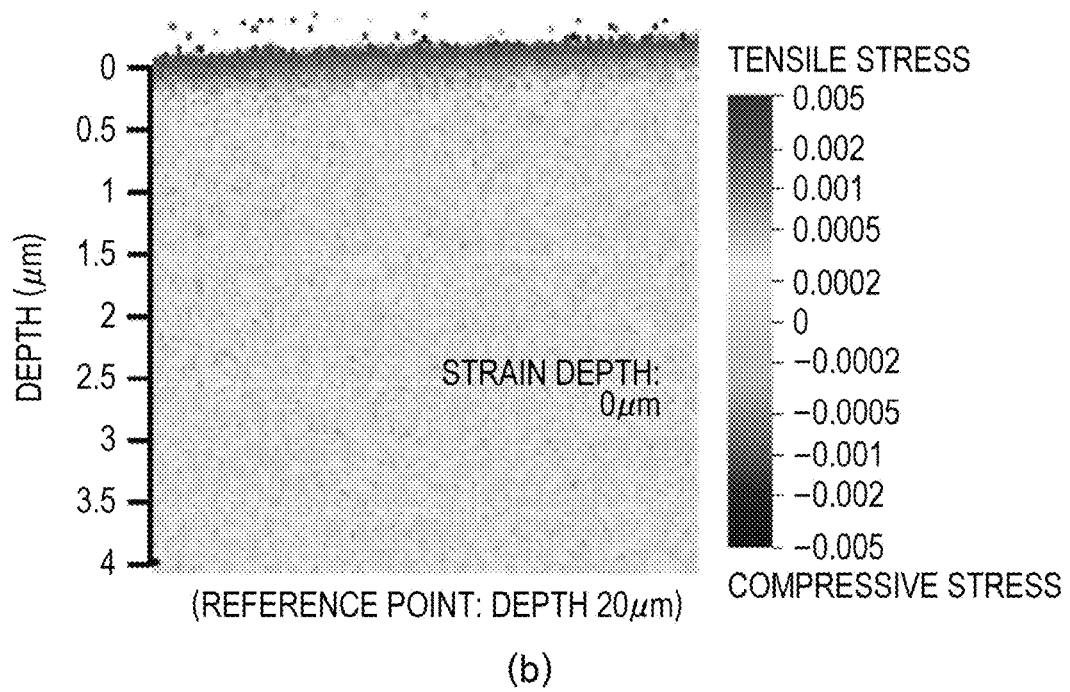

As illustrated in FIG. 8(*a*), lattice strain having a depth of 5 μm was observed in the SiC base substrate 10 before the etching step S10. This is lattice strain introduced during machining, and it can be seen that there is the subsurface damaged layer 12. In FIG. 8(*a*), compressive stress is observed.

FIG. 8(*b*) is a cross-sectional SEM-EBSD captured image of the SiC base substrate 10 after the etching step S10 of Example 1.

As illustrated in FIG. 8(*b*), no lattice strain was observed in the SiC base substrate 10 after the etching step S10. That is, it can be seen that the subsurface damaged layer 12 was removed by the etching step S10.

MSB was formed on the surface of the SiC base substrate 10 after the etching.

As described above, according to the etching step S10, the SiC base substrate 10 and the SiC material 40 are arranged so as to face each other, heating is performed so that the SiC base substrate 10 is on the high temperature side and the SiC material 40 is on the low temperature side, and etching is performed. Therefore, the subsurface damaged layer 12 can be removed or reduced. As a result, the SiC substrate layer 13 can be formed on the bulk layer 11 from which the subsurface damaged layer 12 has been reduced or removed, so that a high-quality SiC substrate 30 can be produced.

Example 2: Removal or Reduction of MSB in the Etching Step

The SiC base substrate 10 was accommodated in the main container 50 and the refractory material container 70, and the heat treatment was performed under the following heat treatment conditions.

[SiC Base Substrate 10]
Polymorphism: 4H—SiC
  Substrate size: Width 10 mm×Length 10 mm×Thickness 0.3 mm
  Off direction and off angle: <11-20>direction and 4° off
  Etched surface: (0001) surface
  Existence of MSB: Exist The step height, terrace width, and existence of MSB can be checked by an atomic force microscope (AFM) or a scanning electron microscope (SEM) image contrast evaluation method disclosed in JP 2015-179082 A.

[Main Container 50]
  Material: Polycrystalline SiC
  Container size: Diameter 60 mm×Height 4 mm
  Substrate holder 54 material: Single crystal SiC
  Distance between SiC base substrate 10 and bottom surface of main container 50: 2 mm
  Si-vapor supply source 55: Single crystal Si piece Atomic number ratio in container Si/C: greater than 1

As described above, by accommodating the Si piece together with the SiC base substrate 10 in the main container 50, the atomic number ratio Si/C in the container is greater than 1.

[Refractory Material Container 70]
  Material: TaC
  Container size: Diameter 160 mm×Height 60 mm
  Si-vapor supply source 74 (Si compound): $TaSi_2$

[Heat Treatment Conditions]

Figure 9:
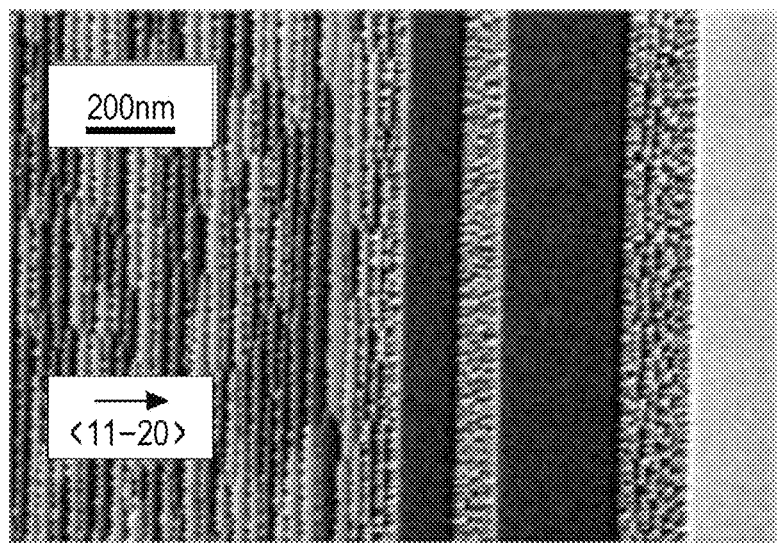
FIG. 9 is an explanatory diagram of a surface of a SiC base substrate obtained in the etching step of the present invention.
Figure 9:
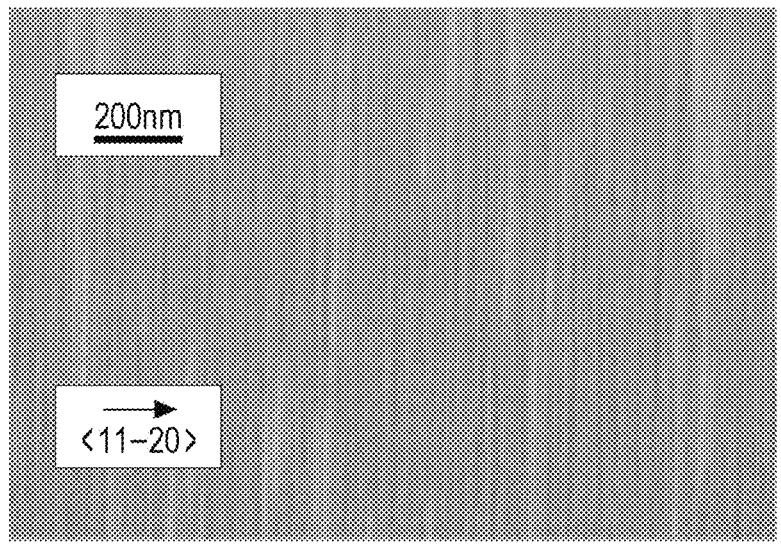

The SiC base substrate 10 arranged under the above condition was heat-treated under the following conditions.
  Heating temperature: 1900° C.
  Heating time: 60 min
  Temperature gradient: 1° C./mm
  Etching rate: 300 nm/min
  Main heating chamber vacuum degree: $10^{-5}$ Pa The step on the surface of the SiC base substrate 10 of Example 2 before and after the etching step S10 was observed by SEM. The results are shown in FIGS. 9(a) and 9(b). The height of the step was measured by an atomic force microscope (AFM). The terrace width was measured by the SEM.

As the value of the terrace width, the average value of the terrace width obtained by dsourceing a line perpendicular to the step of the captured SEM image and counting the number of steps existing on this line was calculated and adopted (terrace width=line length/number of steps on the line).

FIG. 9(a) is an SEM image of the surface of the SiC base substrate 10 before the etching step S10 of Example 2. MSB having a height of 3 nm or more is formed on the surface of the SiC base substrate 10 before the etching step S10. The step height was measured by AFM.

FIG. 9(b) is an SEM image of the surface of the SiC base substrate 10 after the etching step S10 of Example 2. It can be seen that no MSB is formed on the surface of the SiC base substrate 10 after the etching step S10 of Example 2, and the steps of 1.0 nm (full unit cell) are regularly arranged.

As described above, according to the etching step S10, MSB can be reduced or removed by etching the SiC base substrate 10 in a semi-closed space having an atomic number ratio of Si/C of greater than 1. As a result, the SiC substrate layer 13 can be formed on the bulk layer 11 from which the MSB has been reduced or removed, so that a high-quality SiC substrate 30 can be produced.

When observed by the SEM-EBSD method, the subsurface damaged layer 12 was also removed from the SiC base substrate 10 after the etching step S10 of Example 2.

Example 3: Removal or Reduction of MSB in the Crystal Growth Step

The SiC base substrate 10 was accommodated in the main container 50 and the refractory material container 70, and the heat treatment was performed under the following heat treatment conditions.

Figure 10:
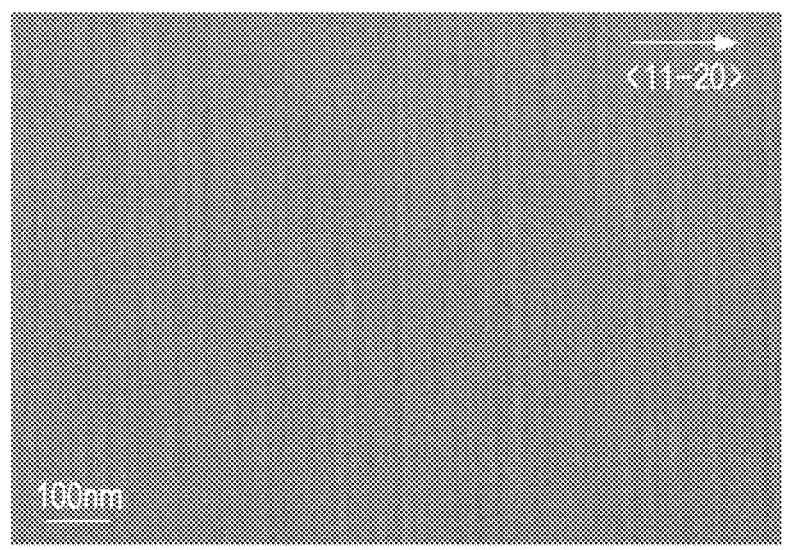
FIG. 10 is an explanatory diagram of a surface of a SiC substrate layer obtained in a crystal growth step of the present invention.

[SiC base substrate 10]
Polymorphism: 4H-SiC
Substrate size: Width 10 mm×Length 10 mm×Thickness 0.3 mm
Off direction and off angle: <11-20>direction and 4° off
Etched surface: (0001) surface
Existence of MSB: Exist
[Main Container 50]
Material: Polycrystalline SiC
Container size: Diameter 60 mm×Height 4 mm
Distance between SiC base substrate 10 and bottom surface of main container 50: 2 mm
Si-vapor supply source 55: Single crystal Si piece
Atomic number ratio in container Si/C: greater than 1
As described above, by accommodating the Si piece together with the SiC base substrate 10 in the main container 50, the atomic number ratio Si/C in the container is greater than 1.
[Refractory Material Container 70]
Material: TaC
Container size: Diameter 160 mm×Height 60 mm
Si-vapor supply source 74 (Si compound): TaSi$_2$
[Heat Treatment Conditions]
The SiC base substrate 10 arranged under the above condition was heat-treated under the following conditions.
Heating temperature: 1800° C.
Heating time: 60 min
Temperature gradient: 1° C./mm
Growth rate: 68 nm/min
Main heating chamber 61 vacuum degree: $10^{-5}$ Pa The step on the surface of the SiC base substrate 10 of Example 3 after the crystal growth step S20 was observed by SEM. The results are shown in FIG. 10. The height of the step was measured by an atomic force microscope (AFM), and the width of the terrace was measured by SEM.

FIG. 10 is an SEM image of the surface of the SiC base substrate 10 after the crystal growth step S20 of Example 3. As similar to FIG. 9(a), MSB having a height of equal to or greater than 3 nm was formed on the surface of the SiC base substrate 10 before the crystal growth step S20. As illustrated in FIG. 10, it can be seen that no MSB is formed on the surface of the SiC base substrate 10 after the crystal growth step S20 of Example 3, and the steps of 1.0 nm (full unit cell) are regularly arranged.

As described above, according to the crystal growth step S20, the SiC substrate layer 13 in which MSB is not formed can be formed by growing the SiC base substrate 10 in a semi-closed space having an atomic number ratio of Si/C of greater than 1. As a result, the SiC substrate 30 in which MSB is reduced or removed can be produced.

Example 4: Removal or Reduction of BPD in the Crystal Growth Step

The SiC base substrate 10 was accommodated in the main container 50 and the refractory material container 70, and the heat treatment was performed under the following heat treatment conditions.

[SiC Base Substrate 10]
Polymorphism: 4H—SiC
Substrate size: Width 10 mm×Length 10 mm×Thickness 0.3 mm
Off direction and off angle: <11-20>direction and 4° off
Growth surface: (0001) surface
Existence of MSB: Not exist
Existence of subsurface damaged layer 12: Not exist
[Main Container 50]
Material: Polycrystalline SiC
Container size: Diameter 60 mm×Height 4 mm
Distance between SiC base substrate 10 and SiC material 40: 2 mm
Atomic number ratio in container Si/C: equal to or less than 1
[Refractory Material Container 70]
Material: TaC
Container size: Diameter 160 mm×Height 60 mm
Si-vapor supply source 74 (Si compound): TaSi$_2$
[Heat Treatment Conditions]
The SiC base substrate 10 arranged under the above condition was heat-treated under the following conditions.
Heating temperature: 1700° C.
Heating time: 300 min
Temperature gradient: 1° C./mm
Growth rate: 5 nm/min
Main heating chamber 61 vacuum degree: $10^{-5}$ Pa
(BPD Conversion Rate in SiC Substrate Layer)

Figure 11:
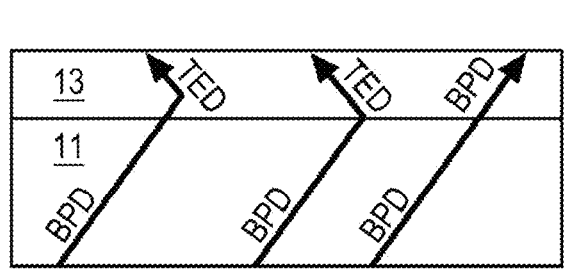
FIG. 11 is an explanatory diagram of a method for obtaining a BPD conversion rate in the crystal growth step of the present invention.
Figure 11:
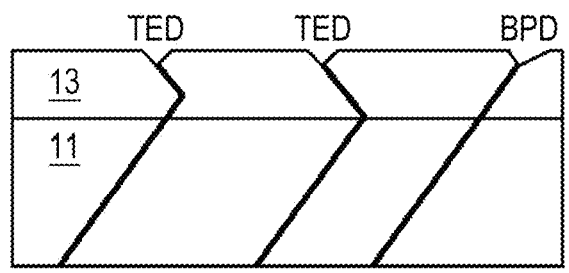
Figure 11:
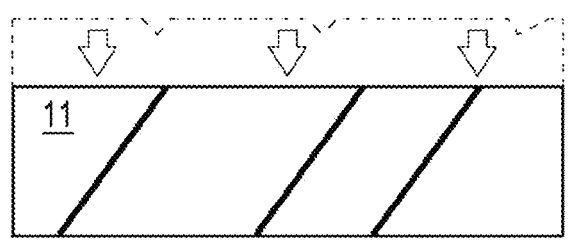
Figure 11:
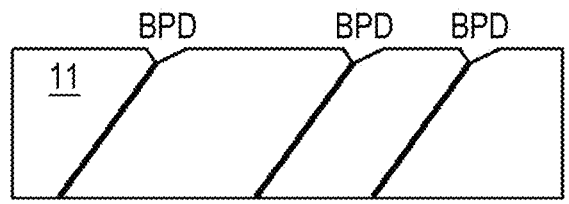

FIG. 11 is an explanatory diagram of a method for obtaining a conversion rate obtained by converting BPD into another defect/dislocation (TED or the like) in the SiC substrate layer 13.

FIG. 11(a) illustrates a situation where the SiC substrate layer 13 has been grown by the crystal growth step S20. In this heating step, the BPD existing in the SiC base substrate 10 is converted to TED with a certain probability. Therefore, TED and BPD are mixed on the surface of the SiC substrate layer 13 unless BPD is 100% converted.

FIG. 11(b) illustrates the situation where a defect in the SiC substrate layer 13 was checked by using the KOH dissolution etching method. This KOH dissolution etching method is a method of immersing a SiC substrate in a molten salt (KOH or the like) heated to about 500° C. to form an etch pit in a dislocation or defective portion, and discriminating a type of dislocation by the size and shape of the etch pit. By this method, the number of BPD existing on the surface of the SiC substrate layer 13 is obtained.

FIG. 11(c) illustrates a situation where the SiC substrate layer 13 is removed after KOH dissolution etching. In this method, after planarization is performed to the depth of the etch pit by mechanical polishing or CMP, the SiC substrate layer 13 is removed by thermal etching to expose the surface of the SiC base substrate 10.

FIG. 11(d) illustrates a state where a defect in the SiC base substrate 10 was checked by using the KOH dissolution etching method for the SiC base substrate 10 from which the SiC substrate layer 13 was removed. By this method, the number of BPD existing on the surface of the SiC base substrate 10 is obtained.

According to the sequence illustrated in FIG. 11, by comparing the number of BPD existing on the surface of the SiC substrate layer 13 (see FIG. 11(b)) with the number of BPD existing on the surface of the SiC base substrate 10 (FIG. 11(d)), the BPD conversion rate of conversion from BPD to another defect/dislocation during the crystal growth step S20 can be obtained.

The number of BPD existing on the surface of the SiC substrate layer 13 of Example 4 was 0 cm$^{-2}$, and the number of BPD existing on the surface of the bulk layer 11 was about 1000 cm$^{-2}$.

That is, it can be understood that BPD is reduced or removed by arranging the SiC base substrate 10 having no MSB on the surface in a semi-closed space having an atomic number ratio of Si/C of equal to or less than 1, and by crystal growth of the SiC base substrate 10.

As described above, according to the crystal growth step S20, by crystal growth of the SiC base substrate 10 in a semi-closed space having an atomic number ratio of Si/C of equal to or less than 1 or less, it is possible to form the SiC substrate layer 13 having a surface on which BPD has been reduced or removed. This makes it possible to produce a SiC substrate 30 having a SiC substrate layer 13 from which BPD has been reduced or removed.

Example 5: Control of Doping Concentration in Crystal Growth Step

The SiC base substrate 10 was accommodated in the main container 50 and the refractory material container 70, and the heat treatment was performed under the following heat treatment conditions.
[SiC Base Substrate 10]
  Polymorphism: 4H-SiC
  Substrate size: Width 10 mm×Length 10 mm×Thickness 0.3 mm
  Off direction and off angle: <11-20>direction and 4° off
  Growth surface: (0001) surface
  Dopant: N
  Doping concentration: 3×10$^{18}$ cm$^{-3}$
  Existence of MSB: Not exist
  Existence of subsurface damaged layer 12: Not exist
The dopant and doping concentration of the SiC base substrate 10 were checked by Raman spectroscopy

Figure 12:
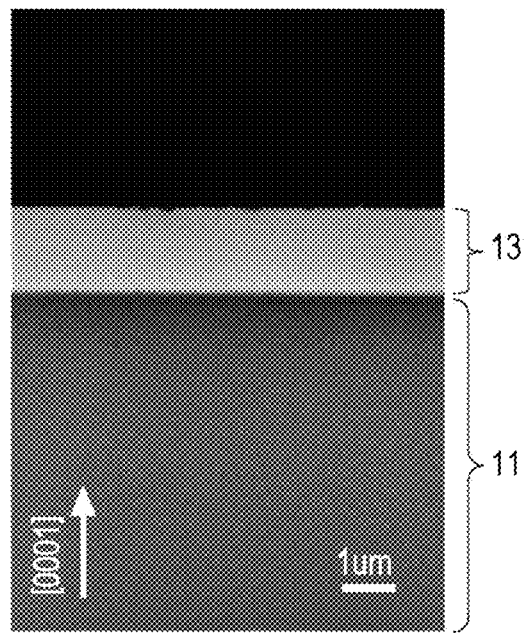
FIG. 12 is an explanatory diagram of a SiC substrate layer formed in the crystal growth step of the present invention.

[Main Container 50].
  Material: Polycrystalline SiC
  Container size: Diameter 60 mm×Height 4 mm
  Distance between SiC base substrate 10 and SiC material 40: 2 mm
  Dopant: N
  Doping concentration: equal to or less than 1×10$^{17}$ cm$^{-3}$ (equal to or less than Raman spectroscopy detection limit)
  Atomic number ratio in container Si/C: equal to or less than 1
[Refractory Material Container 70]
  Material: TaC
  Container size: Diameter 160 mm×Height 60 mm
  Si-vapor supply source 74 (Si compound): TaSi$_2$
[Heat Treatment Conditions]
  The SiC base substrate 10 arranged under the above condition was heat-treated under the following conditions.
  Heating temperature: 1700° C.
  Heating time: 300 min
  Temperature gradient: 1° C./mm
  Growth rate: 5 nm/min
  Main heating chamber 61 vacuum degree: 10$^{-5}$ Pa FIG. 12 is an SEM image of the SiC substrate of Example 5 grown under the above conditions observed from a cross section at a magnification of 10000. The thickness of the SiC substrate layer 13 of Example 5 was 1.5 μm.

The doping concentration of the SiC substrate layer 13 of Example 5 was equal to or less than 1×10$^{17}$ cm$^{-3}$, and the doping concentration of the SiC base substrate 10 was 3×10$^{18}$ cm$^{-3}$. From this, it can be seen that the SiC substrate layer 13 inherits the doping concentration of the SiC material 40. As illustrated in FIG. 12, since the SiC substrate layer 13 has a brighter SEM image contrast than the SiC base substrate 10, it can be understood that the doping concentration of the SiC substrate layer 13 is lower than that of the SiC base substrate 10.

Example 6: Control of Doping Concentration in Crystal Growth Step

The SiC base substrate 10 was accommodated in the main container 50 and the refractory material container 70 under the following conditions.
[SiC Base Substrate 10]
  The same SiC base substrate 10 as in Example 5 was used.
[Main Container 50]
  The same main container 50 as in Example 5 was used.
[Refractory Material Container 70]
  The same refractory material container 70 as in Example 5 was used.
[Heat Treatment Conditions]
  The SiC base substrate 10 arranged under the above condition was heat-treated under the following conditions.
  Heating temperature: 1800° C.
  Heating time: 60 min
  Temperature gradient: 1° C./mm
  Growth rate: 50 nm/min
  Etching rate: 50 nm/min
  Main heating chamber 61 vacuum degree: 13 Pa (N$_2$ gas was introduced)

Figure 13:
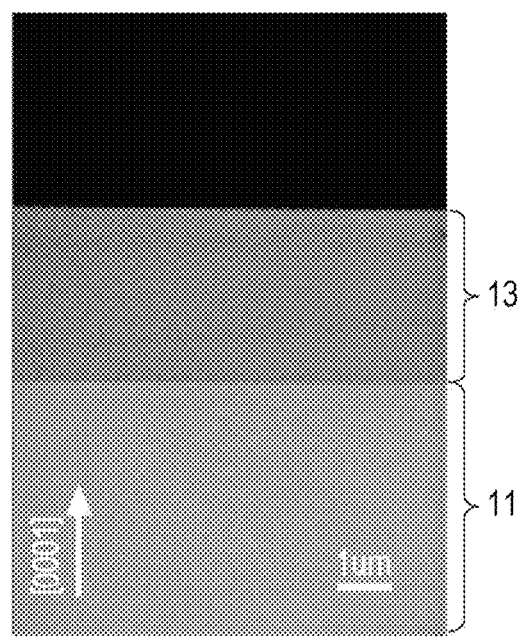
FIG. 13 is an explanatory diagram of a SiC substrate layer formed in the crystal growth step of the present invention.

FIG. 13 is an SEM image of the SiC substrate 30 of Example 6 grown under the above conditions observed from a cross section at a magnification of 10000.

The thickness of the SiC substrate layer 13 of Example 6 was 3 μm.

The doping concentration of the SiC substrate layer 13 of Example 6 was equal to or less than 2×10$^{19}$ cm$^{-3}$, and the doping concentration of the bulk layer 11 was 3×10$^{18}$ cm$^{-3}$. That is, the doping concentration of the SiC substrate layer 13 is higher than the doping concentration of the SiC base substrate 10. As illustrated in FIG. 13, this can be confirmed from the fact that the SiC substrate layer 13 has a darker SEM image contrast than that of the bulk layer 11.

According to the method for producing a SiC substrate according to the present invention, the doping concentration of the SiC substrate layer 13 can be controlled by selecting the doping concentration of the SiC material 40 and introducing $N_2$ gas during the crystal growth step S20. This makes it possible to produce the SiC substrate 30 having a desired doping concentration.

<Thermodynamic Calculation>

Figure 14:
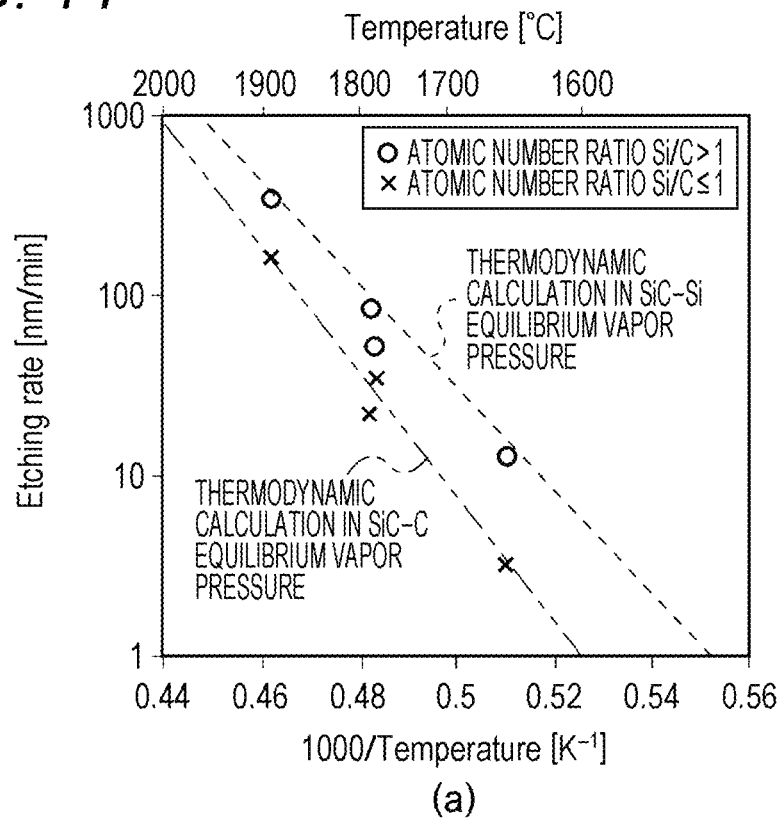
FIG. 14 is an Arrhenius plot of the etching step and the crystal growth step of the present invention.
Figure 14:
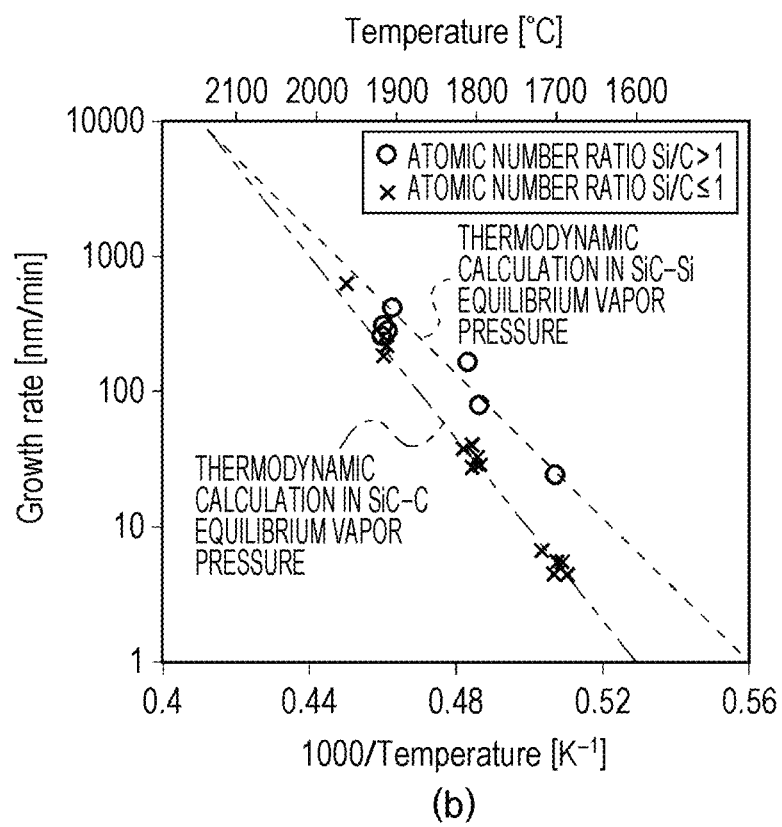

FIG. 14(*a*) is a graph showing the relationship between the heating temperature and the etching rate in the etching step of the present invention. The horizontal axis of this graph is the reciprocal of temperature, and the vertical axis of this graph shows the etching rate logarithmically.

FIG. 14(*b*) is a graph showing the relationship between the heating temperature and the growth rate in the crystal growth step of the present invention. The horizontal axis of this graph is the reciprocal of temperature, and the vertical axis of this graph shows the growth rate logarithmically.

In the graph of FIG. 14, the result of heat treatment of the SiC base substrate 10 by arranging the SiC base substrate 10 in a space (inside the main container 50) where the atomic number ratio Si/C is greater than 1 is indicated by o. Further, the result of heat treatment of the SiC base substrate 10 by arranging the SiC base substrate 10 in a space (inside the main container 50) where the atomic number ratio Si/C is equal to or less than 1 is indicated by x.

No MSB was formed on the surface of the SiC base substrate 10 marked with a circle, and the step was the height of one unit cell. On the other hand, MSB was formed on the surface of the SiC base substrate 10 marked with x.

In the graph of FIG. 14, the result of the thermodynamic calculation in the SiC—Si equilibrium vapor pressure environment is shown by a broken line (Arrhenius plot), and the result of the thermodynamic calculation in the SiC—C equilibrium vapor pressure environment is shown by the two-dot chain line (Arrhenius plot).

The thermodynamic calculation of the etching step and the thermodynamic calculation of the crystal growth step will be separately described in detail below.

(Thermodynamic Calculation of Etching Step)

In the thermodynamic calculation of the etching step, the amount of vapor (gas phase species containing Si element and gas phase species containing C element) generated from the SiC base substrate 10 when the main container 50 is heated can be converted into the etching amount. In that case, the etching rate of the SiC base substrate 10 can be obtained by the following Math. 1.

$$\text{Etching rate } (m/s) \propto \sum_{i=SiC, Si_2C, SiC_2} \frac{P_i}{\sqrt{2\pi m_i k T}} \quad [\text{Math. 1}]$$

Here, T is the temperature of the SiC base substrate 10, $m_i$ is the mass of one molecule of the gas phase species ($Si_xC_y$), and k is the Boltzmann constant.

$P_i$ is a value obtained by summing the vapor pressure generated in the main container 50 by heating the SiC base substrate 10. As the gas phase species of $P_i$, SiC, $Si_2C$, $SiC_2$ and the like are assumed.

The broken line in FIG. 14(*a*) shows the result of thermodynamic calculation when the single crystal SiC is etched in a vapor pressure environment when SiC (solid) and Si (liquid phase) are in a phase equilibrium state via a gas phase. Specifically, the thermodynamic calculation was performed under the following conditions (i) to (iv) using Math. 1. (i) An environment is a SiC—Si equilibrium vapor pressure environment with a constant volume, (ii) the etching driving force is the temperature gradient in the main container 50, (iii) the source material gas is SiC, $Si_2C$, $SiC_2$, and (iv) the desorption coefficient at which the source material sublimates from the step is 0.001.

The two-dot chain line in FIG. 14(*a*) shows the result of thermodynamic calculation when the single crystal SiC is etched in a vapor pressure environment when SiC (solid phase) and C (solid phase) are in a phase equilibrium state via a gas phase. Specifically, the thermodynamic calculation was performed under the following conditions (i) to (iv) using Math. 1. (i) An environment is a SiC—C equilibrium vapor pressure environment with a constant volume, (ii) the etching driving force is the temperature gradient in the main container 50, (iii) the source material gas is SiC, $Si_2C$, $SiC_2$, and (iv) the desorption coefficient at which the source material sublimates from the step is 0.001.

Values in the JANAF thermochemical table were used for the data of each chemical species used in the thermodynamic calculation.

According to the graph of FIG. 14(*a*), it can be seen that the tendency in the result (indicated by circles) of etching the SiC base substrate 10 by arranging the SiC base substrate 10 in a space (inside the main container 50) where the atomic number ratio Si/C is greater than 1 coincides with the tendency in the result of the thermodynamic calculation of the single crystal SiC etching in the SiC—Si equilibrium vapor pressure environment.

Further, it can be seen that the tendency in the result (indicated by x) of etching the SiC base substrate 10 by arranging the SiC base substrate 10 in a space (inside the main container 50) where the atomic number ratio Si/C is equal to or less than 1 coincides with the tendency in the result of the thermodynamic calculation of the single crystal SiC etching in the SiC—C equilibrium vapor pressure environment.

Under the conditions marked with o where etching is performed under the SiC—Si equilibrium vapor pressure environment, the formation of MSB is decomposed and suppressed, and steps with a height of 1 nm (one unit cell) are aligned on the surface of the SiC base substrate 10.

On the other hand, it can be seen that MSB is formed under the conditions marked with x where etching is performed under the SiC—C equilibrium vapor pressure environment.

(Thermodynamic Calculation of Crystal Growth Step)

Next, in the thermodynamic calculation of the crystal growth step, the partial pressure difference between the vapor generated from the SiC source material and the vapor generated from the SiC substrate when the main container 50 is heated can be converted into the growth amount. At this time, the chemical potential difference and the temperature gradient can be assumed as the growth driving force. This chemical potential difference can be assumed to be the partial pressure difference of the gas phase species generated on the surface of the polycrystalline SiC (SiC material 40) and the single crystal SiC (SiC base substrate 10). In that case, the growth rate of the SiC can be obtained by the following Math. 2.

$$\text{Growth rate } (m/s) \propto \sum_{i=SiC,Si_2C,SiC_2} \frac{(P_{rawmaterial\,i} - P_{substrate\,i})}{\sqrt{2\pi m_i kT}} \quad [\text{Math. 2}]$$

Here, T is the temperature of the SiC source material side, $m_i$ is the mass of one molecule of the gas phase species ($Si_xC_y$), and k is the Boltzmann constant.

The $P_{source\,material} - P_{substrate}$ is the amount of growth precipitated as SiC when the source material gas becomes supersaturated, and SiC, $Si_2C$, and $SiC_2$ are assumed as the source material gas.

That is, the broken line in FIG. 14(b) shows the result of thermodynamic calculation when the single crystal SiC is grown using polycrystalline SiC as a source material in a vapor pressure environment when SiC (solid) and Si (liquid phase) are in a phase equilibrium state via a gas phase.

Specifically, the thermodynamic calculation was performed under the following conditions (i) to (iv) using Math. 2. (i) An environment is a SiC—Si equilibrium vapor pressure environment with a constant volume, (ii) the growth driving force is the temperature gradient in the main container 50 and the vapor pressure difference (chemical potential difference) between polycrystalline SiC and single crystal SiC, (iii) the source material gas is SiC, $Si_2C$, $SiC_2$, and (iv) the adsorption coefficient at which the source material adsorbs to the step of the SiC base substrate 10 is 0.001.

Further, the two-dot chain line in FIG. 14(b) shows the result of thermodynamic calculation when the single crystal SiC is grown using polycrystalline SiC as a source material in a vapor pressure environment when SiC (solid phase) and C (solid phase) are in a phase equilibrium state via a gas phase.

Specifically, the thermodynamic calculation was performed under the following conditions (i) to (iv) using Math. 2. (i) An environment is a SiC—C equilibrium vapor pressure environment with a constant volume, (ii) the growth driving force is the temperature gradient in the main container 50 and the vapor pressure difference (chemical potential difference) between polycrystalline SiC and single crystal SiC, (iii) the source material gas is SiC, $Si_2C$, $SiC_2$, and (iv) the adsorption coefficient at which the source material adsorbs to the step of the SiC base substrate 10 is 0.001.

Values in the JANAF thermochemical table were used for the data of each chemical species used in the thermodynamic calculation.

According to the graph of FIG. 14(b), it can be seen that the tendency in the result (indicated by circles) of growing the SiC substrate layer 13 on the SiC base substrate 10 by arranging the SiC base substrate 10 in a space (inside the main container 50) where the atomic number ratio Si/C is greater than 1 coincides with the tendency in the result of the thermodynamic calculation of the SiC growth in the SiC—Si equilibrium vapor pressure environment.

Further, it can be seen that the tendency in the result (indicated by x) of growing the SiC substrate layer 13 on the SiC base substrate 10 by arranging the SiC base substrate 10 in a space (inside the main container 50) where the atomic number ratio Si/C is equal to or less than 1 coincides with the tendency in the result of the thermodynamic calculation of the SiC growth in the SiC—C equilibrium vapor pressure environment.

In the SiC—Si equilibrium vapor pressure environment, it is estimated that a growth rate of equal to or greater than 1.0 μm/min is achieved at a heating temperature of 1960° C. Further, it is estimated that a growth rate of equal to or greater than 2.0 μm/min is achieved at a heating temperature of equal to or higher than 2000° C.

On the other hand, in the SiC—C equilibrium vapor pressure environment, it is estimated that a growth rate of equal to or greater than 1.0 μm/min is achieved at a heating temperature of 2000° C. Further, it is estimated that a growth rate of equal to or greater than 2.0 μm/min is achieved at a heating temperature of equal to or higher than 2030° C.

REFERENCE SIGNS LIST

10 SiC base substrate
11 Bulk layer
12 Subsurface damaged layer
13 SiC substrate layer
20 SiC substrate body
30 SiC substrate
40 SiC material
50 Main container
51 Upper container
52 Lower container
53 Gap
54 Substrate holder
55 Si-vapor supply source
60 Heating furnace
61 Main heating chamber
62 Preheating chamber
63 Moving means
64 Heater
65 Vacuum forming valve
66 Inert gas injection valve
67 Vacuum gauge
70 Refractory material container
71 Upper container
72 Lower container
73 Gap
74 Si-vapor supply source
S1 Source material transport space
X Etching space
Y Crystal growth space
S10 Etching step
S20 Crystal growth step
S30 Peeling step
S31 Laser irradiation step
S32 Separation step

The invention claimed is:

1. A method for producing a SiC substrate, the method comprising:
an etching step of etching a SiC base substrate with a subsurface damaged layer by thermal decomposition to reduce the subsurface damaged layer of the SiC base substrate by accommodating the SiC base substrate in a SiC main container, arranging the SiC base substrate and the SiC container so as to face each other, and performing heating at least 20 min in a temperature range of 1400° C. or higher and 2300° C. or lower so as to form a temperature gradient that the SiC base substrate is on the high temperature side and the SiC main container is on the low temperature side;
a crystal growth step of growing a SiC substrate layer on the SiC base substrate to obtain a SiC substrate body by accommodating the SiC base substrate in the SiC main container, arranging the SiC base substrate and the SiC main container so as to face each other, and performing heating in a temperature range of 1400° C. or higher and 2300° C. or lower so as to form a temperature gradient that the SiC base substrate is on the low temperature side and the SiC main container is on the high temperature side; and a peeling step of peeling a part of the SiC substrate body to obtain a SiC substrate after the etching process and the crystal growth process.

2. The method for producing a SiC substrate according to claim 1, wherein the etching step and the crystal growth step are steps of heating the SiC base substrate and the SiC main container in an atmosphere containing Si element and C element.

3. The method for producing a SiC substrate according to claim 1, wherein the etching step and the crystal growth step are steps of heating the SiC base substrate and the SiC main container in a semi-closed space.

4. The method for producing a SiC substrate according to claim 1, wherein the etching step of etching the SiC base substrate with the subsurface damaged layer by thermal decomposition to reduce the subsurface damaged layer of the SiC base substrate by accommodating the SiC base substrate in the SiC main container, arranging the SiC base substrate and the SiC main container so as to face each other, and performing heating at least 60 min in the temperature range of 1400° C. or higher and 2300° C. or lower so as to form the temperature gradient that the SiC base substrate is on the high temperature side and the SiC main container is on the low temperature side.

5. The method for producing a SiC substrate according to claim 1, wherein the etching step includes a step of arranging the SiC base substrate and the SiC main container so as to face each other in a semi-closed space having an atomic number ratio Si/C of greater than 1, and performing heating so that the SiC base substrate is on the high temperature side and the SiC main container is on the low temperature side.

6. The method for producing a SiC substrate according to claim 1, wherein the crystal growth step includes a step of arranging the SiC base substrate and the SiC main container so as to face each other in a semi-closed space having an atomic number ratio Si/C of greater than 1, and performing heating so that the SiC base substrate is on the low temperature side and the SiC main container is on the high temperature side.

7. The method for producing a SiC substrate according to claim 1, wherein the crystal growth step includes a step of arranging the SiC base substrate and the SiC main container so as to face each other in a semi-closed space having an atomic number ratio Si/C of equal to or less than 1, and performing heating so that the SiC base substrate is on the low temperature side and the SiC main container is on the high temperature side.

8. The method for producing a SiC substrate according to claim 1, wherein the peeling step includes
 a laser irradiation step of introducing a damaged layer into the SiC substrate body and
 a separation step of performing separation with the damaged layer as a starting point.

9. The method for producing a SiC substrate according to claim 1, further comprising
 an etching step of etching the SiC base substrate that has been peeled,
 a crystal growth step of growing another SiC substrate layer on the SiC base substrate to obtain another SiC substrate body, and
 a peeling step of peeling a part of the another SiC substrate body.

10. The method for producing a SiC substrate according to claim 1, further comprising
 an etching step of etching the SiC substrate that has been peeled,
 a crystal growth step of growing another SiC substrate layer on the SiC substrate to obtain another SiC substrate body, and
 a peeling step of peeling a part of the another SiC substrate body.

11. The method for producing a SiC substrate according to claim 1,
 wherein the temperature range in the etching step is 1800° C. or higher and 2300° C. or lower.

* * * * *